(12) United States Patent
Kozuma et al.

(10) Patent No.: US 9,401,364 B2
(45) Date of Patent: Jul. 26, 2016

(54) SEMICONDUCTOR DEVICE, ELECTRONIC COMPONENT, AND ELECTRONIC DEVICE

(71) Applicant: SEMICONDUCTOR ENERGY LABORATORY CO., LTD., Kanagawa-ken (JP)

(72) Inventors: Munehiro Kozuma, Kanagawa (JP); Takayuki Ikeda, Kanagawa (JP); Yoshiyuki Kurokawa, Kanagawa (JP); Takeshi Aoki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/856,097

(22) Filed: Sep. 16, 2015

(65) Prior Publication Data

US 2016/0086958 A1 Mar. 24, 2016

(30) Foreign Application Priority Data

Sep. 19, 2014 (JP) ................. 2014-190980

(51) Int. Cl.
*H01L 29/10* (2006.01)
*H01L 27/11* (2006.01)
*H01L 29/786* (2006.01)

(52) U.S. Cl.
CPC ............ *H01L 27/11* (2013.01); *H01L 29/7869* (2013.01)

(58) Field of Classification Search
CPC ............. H01L 29/7869; H01L 21/02554; H01L 21/02565; H01L 29/66969; H01L 21/02631; H01L 27/1225; H01L 2924/0002; H01L 2924/00; H01L 29/78696; H01L 21/02422; H01L 29/78618; H01L 27/3244; H01L 29/78
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N. et al., "Crystallization and Reduction of SOL-GEL-Derived Zinc Oxide Films by Irradiation with Ultraviolet Lamp", Journal of SOL-GEL Science and Technology, 2003, vol. 26, pp. 181-184.

(Continued)

*Primary Examiner* — Robert Bachner
(74) *Attorney, Agent, or Firm* — Nixon Peabody LLP; Jeffrey L. Costellia

(57) ABSTRACT

A semiconductor device has a function of storing data and includes an output terminal, a first terminal, a second terminal, a first circuit, and second circuits. The first circuit has a function of keeping the potential of the output terminal to be a high-level or low-level potential. The second circuits each include a first pass transistor and a second pass transistor which are electrically connected in series, a first memory circuit, and a second memory circuit. The first and second memory circuits each have a function of making a potential retention node in an electrically floating state. The potential retention nodes of the first and second memory circuits are electrically connected to gates of the first and second pass transistors, respectively. A transistor including an oxide semiconductor layer may be provided in the first and second memory circuits.

13 Claims, 28 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,542,034 B2 | 9/2013 | Kato |
| 8,547,753 B2 | 10/2013 | Takemura et al. |
| 8,581,625 B2 | 11/2013 | Yoneda et al. |
| 8,970,251 B2 | 3/2015 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2013/0207170 A1 | 8/2013 | Kurokawa |
| 2013/0293263 A1 | 11/2013 | Kurokawa |
| 2015/0171865 A1 | 6/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-251894 A | 12/2013 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and SN-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Paper, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Cyrstalline Blue Phases for Display Application", SID Digest '07 :SID International Symposium Digest of Technical Papers, 2007,vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFe2O4, and YB2Fe3O7 Types of Structures for Compounds in the In2O3 and SC2O3—A2O3—BO Systems [A;Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 :Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1216.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-cyrstalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B. (Physical Review.B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Lotze. N. et al., "A 62 mV 0.13 µm CMOS Standard-Cell-Based Design Technique Using Schmitt-Trigger Logic", IEEE Journal of Solid-State Circuits, vol. 47, No. 1, pp. 47-60, Jan. 2012.

Calhoun. B et al., "Flexible Circuits and Architectures for Ultralow Power", Proceedings of the IEEE, vol. 98, No. 2, pp. 267-282, Feb. 2010.

Grossmann. P etal., "Minimum Energy Analysis and Experimental Verification of a Latch-Based Subthreshold FPGA", IEEE Transactions on Circuits and Systems, vol. 59, No. 12, pp. 942-946, Dec. 2012.

Aoki. T et al., "Normally-Off Computing with Crystalline InGaZnO-based FPGA", ISSCC 2014 (Digest of Technical Papers. IEEE International Solid-State Circuits Conference), pp. 502-504, Feb. 12, 2014.

Zimmermann. R et al., "Low-Power Logic Styles: CMOS Versus Pass-Transistor Logic", IEEE Journal of Solid-State Circuits, vol. 32, No. 7, pp. 1079-1090.

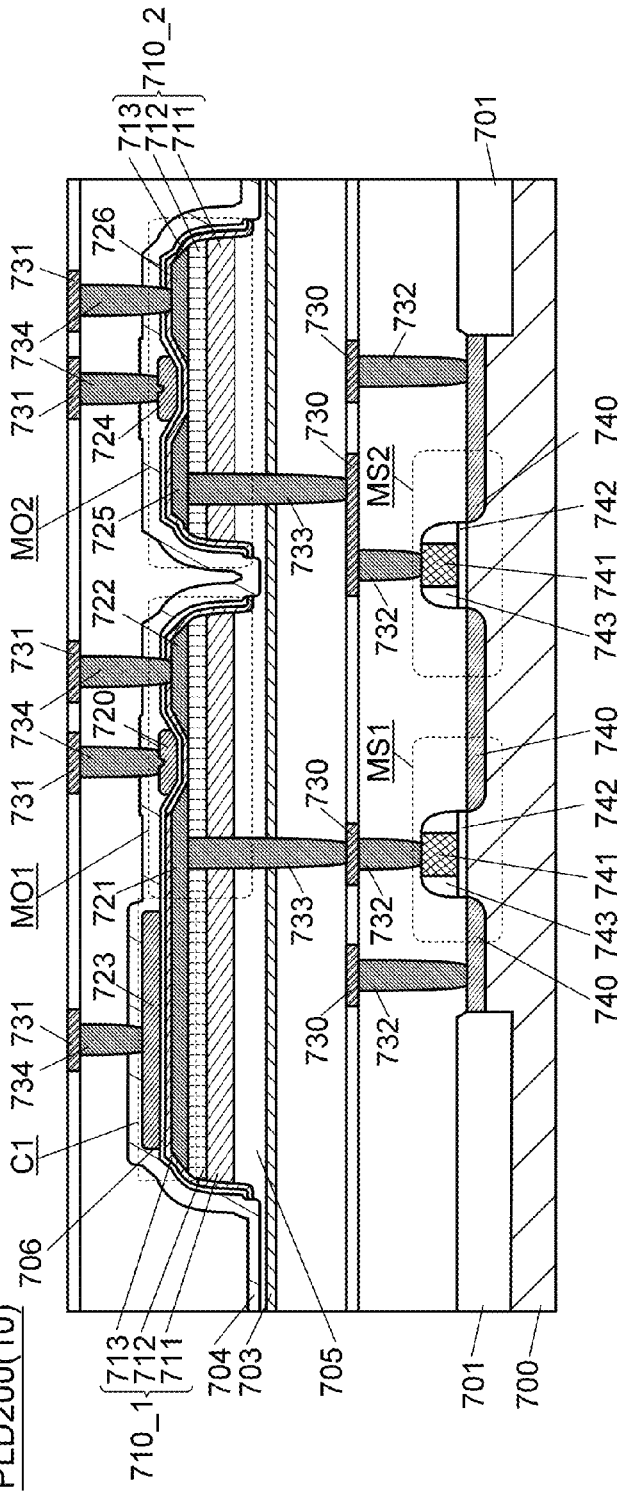
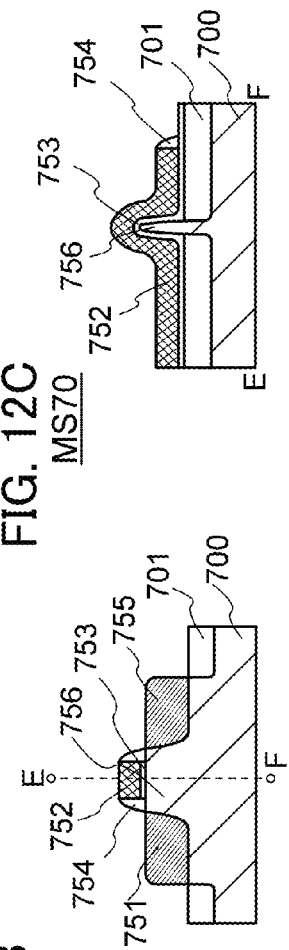
FIG. 12A
FIG. 12B
FIG. 12C

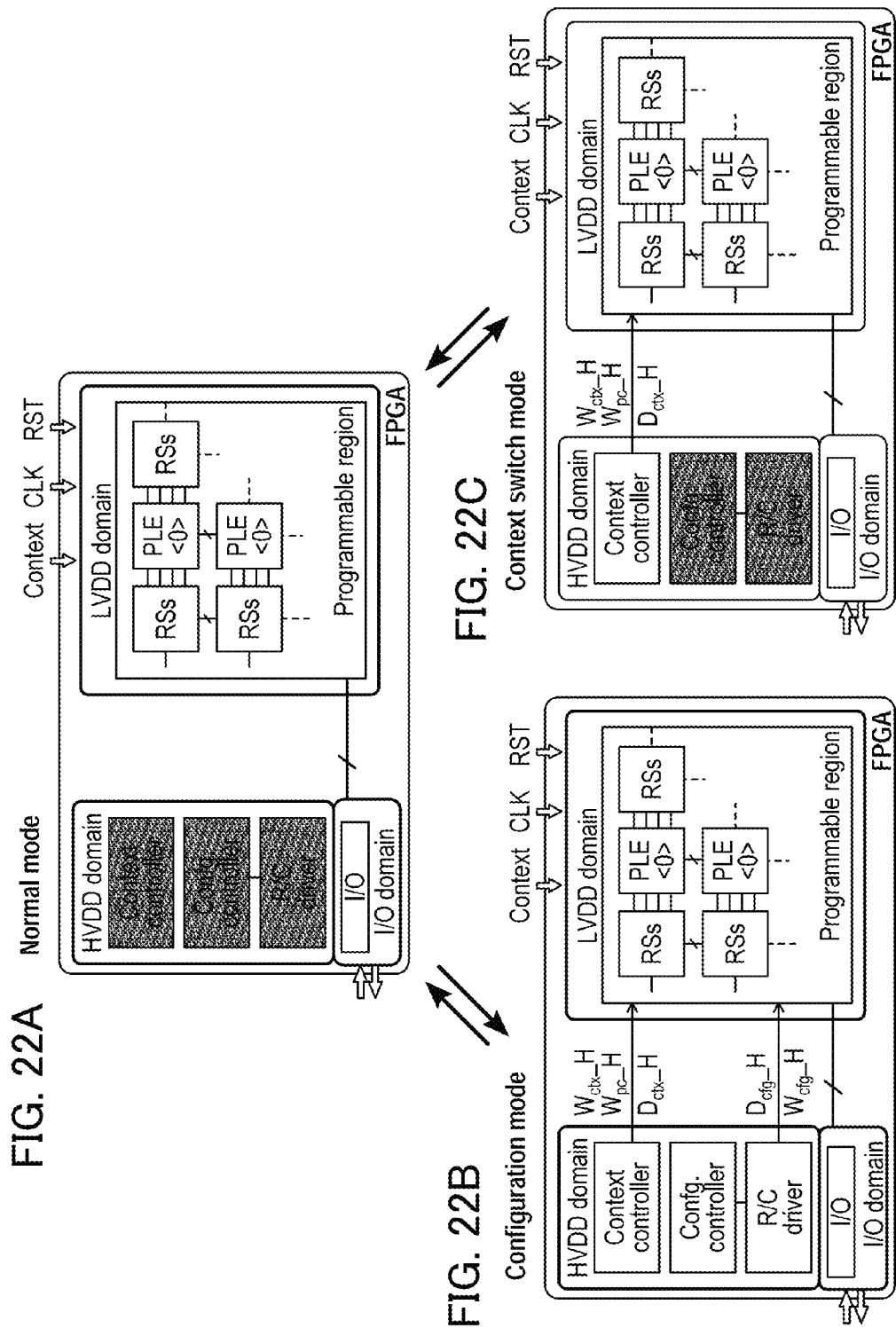

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device, an electronic component, or an electronic device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a lighting device, a power storage device, a memory device, a method for driving any of them, and a method for manufacturing any of them.

2. Description of the Related Art

A programmable logic device (PLD) includes a plurality of programmable logic elements (PLEs) and a plurality of programmable switch elements. In the PLD, data on a function of each PLE and data on a connection between PLEs by the programmable switch elements are stored as configuration data in a configuration memory.

In a configuration memory that has recently become widely available, configuration data is stored in an inverter loop used in a static random access memory (SRAM). A potential to be retained in the inverter loop is supplied to a gate of a path transistor and an output signal is output. Change of the function of a programmable logic element, and the like can be performed using the output signal.

In recent years, a structure of a configuration memory in which one of a source and a drain of a transistor including a channel in an oxide semiconductor layer is connected to a gate of a path transistor, and a potential corresponding to configuration data is retained in the gate of the path transistor has been proposed (e.g., Patent Document 1).

Reference

Patent Document

[Patent Document 1] Japanese Published Patent Application No. 2013-251894

Non-Patent Documents

[Non-Patent Document 1] B. H. Calhoun et al., "Flexible Circuits and Architectures for Ultralow Power", *Proceedings of The IEEE*, February 2010, pp. 267-282

[Non-Patent Document 2] P. J. Grossmann et al., "Minimum Energy Analysis and Experimental Verification of a Latch-Based Subthreshold FPGA", *IEEE Trans. Circuits and Systems*, December 2012, vol. 59, no. 12, pp. 942-946

[Non-Patent Document 3] T. Aoki et al., "Normally-Off Computing with Crystalline InGaZnO-based FPGA", *IEEE ISSCC Dig. Tech. Papers*, 2014, pp. 502-503

[Non-Patent Document 4] N. Lotze et al., "A 62 mV 0.13 µm CMOS Standard-Cell-Based Design Technique Using Schmitt-Trigger Logic", *IEEE J. Solid-State Circuits*, January 2012, vol. 47, no. 1, pp. 47-60

[Non-Patent Document 5] R. Zimmermann and W. Fichtner, "Low-Power Logic Styles: CMOS Versus Pass-Transistor Logic", *IEEE J. Solid-State Circuits*, July 1997, vol. 32, no. 7, pp. 1079-1090

SUMMARY OF THE INVENTION

An object of one embodiment of the present invention is to lower power consumption or reduce a circuit area. An object of another embodiment of the present invention is to provide a semiconductor device with a novel structure, an operation method of the semiconductor device, and the like.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is a semiconductor device including an output terminal, a first terminal, a second terminal, a first circuit, and a second circuit. The first circuit includes a first transistor, a second transistor, and an inverter. The second circuit includes a third transistor, a fourth transistor, a third circuit, and a fourth circuit. The third circuit includes a first node. The fourth circuit includes a second node. An input terminal of the inverter is electrically connected to the second terminal, and an output terminal of the inverter is electrically connected to the output terminal. The first transistor and the second transistor are electrically connected in parallel between the second terminal and a wiring supplied with a first potential. A gate of the first transistor is electrically connected to the output terminal of the inverter. The third circuit is configured to make the first node in an electrically floating state. The fourth circuit is configured to make the second node in an electrically floating state. The third transistor and the fourth transistor are electrically connected in series between the first terminal and the second terminal. The first node is electrically connected to the gate of the third transistor, and the second node is electrically connected to a gate of the fourth transistor.

In the above embodiment, the semiconductor device may further include a third terminal and a fourth terminal. The third circuit may include a fifth transistor. The fourth circuit may include a sixth transistor. The fifth transistor may be configured to control a conduction state between the third terminal and the first node. The sixth transistor may be configured to control a conduction state between the fourth terminal and the second node. Here, the fifth transistor and the sixth transistor may each include an oxide semiconductor layer where a channel is formed.

Another embodiment of the present invention is a semiconductor device including an output terminal, a first terminal, a second terminal, a first circuit, and second circuits. The second circuits are electrically connected in parallel between the first terminal and the second terminal. The first circuit includes a first transistor, a second transistor, and an inverter. The second circuit includes a third transistor, a fourth transistor, a fifth transistor, a sixth transistor, a first node, a second node, a third terminal, and a fourth terminal. An input terminal of the inverter is electrically connected to the second terminal, and an output terminal of the inverter is electrically connected to the output terminal. The first transistor and the second transistor are electrically connected in parallel between the second terminal and a wiring supplied with a first potential. A gate of the first transistor is electrically connected to the output terminal of the inverter. The third transistor and the fourth transistor are electrically connected in series between the first terminal and the second terminal. The first node is electrically connected to a gate of the third transistor. The second node is electrically connected to a gate of the fourth transistor. The fifth transistor is configured to control a conduction state between the first node and the third terminal. The sixth transistor is configured to control a conduction state between the second node and the fourth terminal.

In the above embodiment, the fifth transistor and the sixth transistor may each include an oxide semiconductor layer where a channel is formed. Furthermore, in the above embodiment, the semiconductor device may further include a switch circuit or a multiplexer. The switch circuit or the multiplexer may include a pass transistor logic and an analog memory that retains a potential of a gate of a pass transistor of the pass transistor logic.

According to one embodiment of the present invention, it is possible to lower power consumption or reduce a circuit area. According to one embodiment of the present invention, it is possible to provide a semiconductor device with a novel structure, an operation method of the semiconductor device, and the like.

Note that the description of the plurality of effects does not disturb the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

FIG. 12A is a cross-sectional view illustrating a device structure example of a PLD, and FIGS. 12B and 12C are cross-sectional views illustrating a structure example of a transistor.

FIGS. 22A to 22C show an operational sequence of an FPGA.

DETAILED DESCRIPTION OF THE INVENTION

Figure 1:
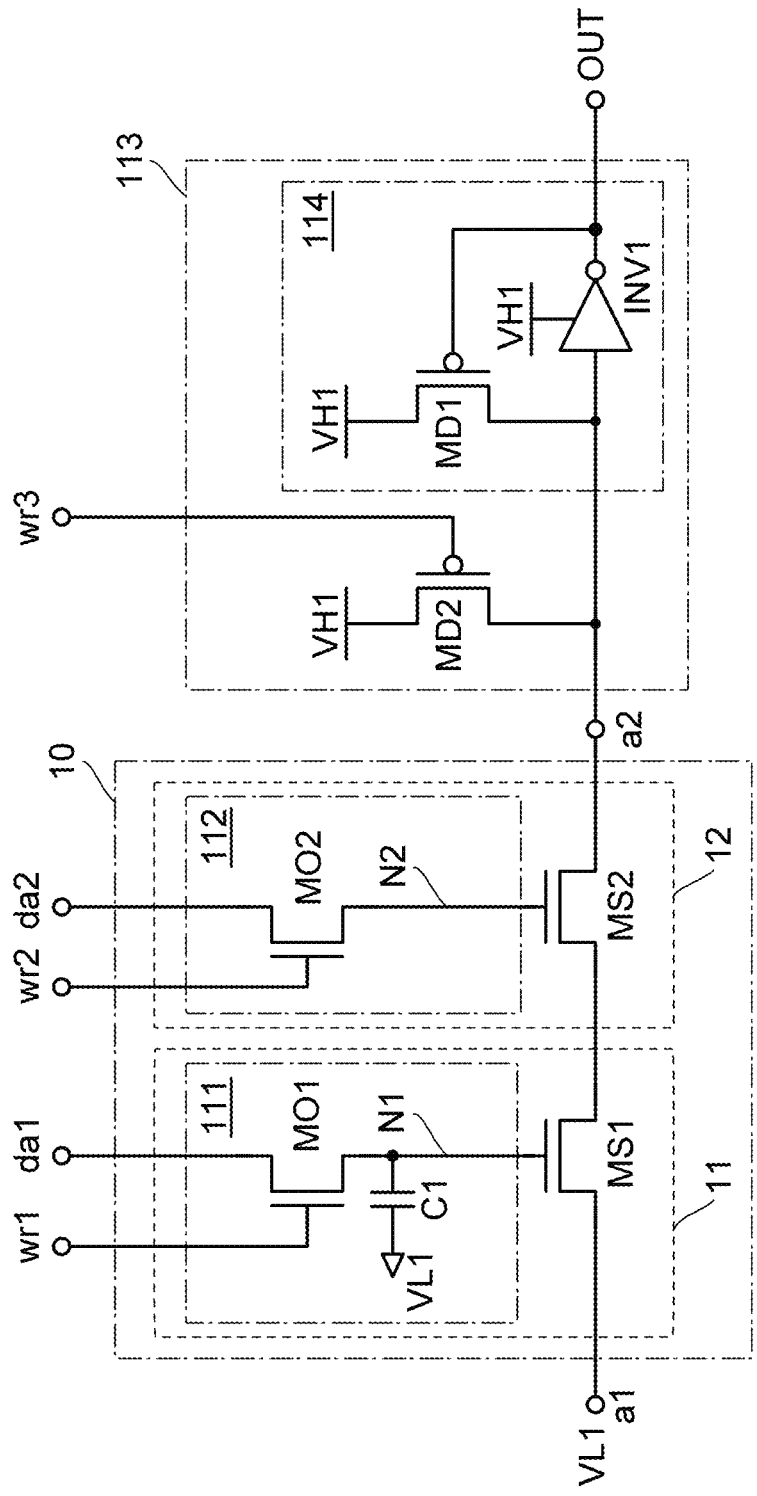
FIG. 1 is a circuit diagram illustrating a configuration example of a memory circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts. Here, each of X and Y denotes an object (e.g., a device, an element, a circuit, a wiring, an electrode, a terminal, a conductive film, a layer, or the like).

A transistor is an element having three terminals: a gate, a source, and a drain. The gate functions as a control terminal for controlling conduction of the transistor. Depending on the channel type of the transistor or levels of potentials applied to the terminals, one of terminals functions as a source and the other functions as a drain. Therefore, the terms "source" and "drain" can be switched in this specification and the like. In this specification and the like, in some cases, two terminals that are not the gate of the transistor are referred to as a first terminal and a second terminal in some cases.

A node can be referred to as a terminal, a wiring, an electrode, a conductor, an impurity region, or the like in accordance with a circuit configuration, a device structure, and the like. Furthermore, a terminal and the like can be referred to as a node.

In many cases, a voltage refers to a potential difference between a certain potential and a reference potential (e.g., a ground potential (GND) or a source potential). A voltage can be referred to as a potential and vice versa. Note that the potential indicates a relative value. Accordingly, "ground potential" does not necessarily mean 0 V.

Note that in this specification, the terms "film" and "layer" can be interchanged depending on the case or circumstances. For example, the term "conductive layer" can be changed into the term "conductive film" in some cases, and the term "insulating film" can be changed into the term "insulating layer" in some cases.

In this specification and the like, ordinal numbers such as "first", "second", and "third" are used to avoid confusion among components, and the terms do not limit the components numerically or do not limit the order.

In the drawings, the same components, components having similar functions, components formed of the same material, or components formed at the same time are denoted by the same reference numerals in some cases, and description thereof is not repeated in some cases. When the same reference numerals need to be distinguished from each other, "_1", "_2", "<n>", "[m, n]", or the like may be added to the reference numerals. For example, to distinguish a plurality of wirings WL from each other, with the use of a row number, a wiring WL in the second row may be referred to as a wiring WL[2].

In this specification and the like, for example, a clock signal CLK is abbreviated to "a signal CLK", "CLK", or the like in some cases. The same applies to other components (e.g., signal, voltage, potential, circuit, element, electrode, and wiring).

In drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

Note that in this specification, terms for describing arrangement, such as "over" and "under", are used in some cases for convenience for describing a positional relation between components with reference to drawings. Further, the positional relation between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

Embodiments and an example of the present invention are described below, and any of the embodiments and example can be combined as appropriate. In addition, in the case where some structure examples are given in one embodiment or example, any of the structure examples can be combined as appropriate. Furthermore, the present invention can be implemented in various different modes, and it will be readily appreciated by those skilled in the art that various changes and modifications of the modes and details are possible, unless such changes and modifications depart from the content and the scope of the invention. Thus, the present invention should not be interpreted as being limited to the following description of the embodiments and the example.

Embodiment 1

In this embodiment, a semiconductor device that has a function of storing data is described.

<Structural Example 1 of Memory Circuit>

A memory circuit 100 illustrated in FIG. 1 includes a circuit 10 and a circuit 113. Potentials VH1 and VL1 are supplied to the memory circuit 100. The potential VH1 is a high power supply potential, and the potential VL1 is a low power supply potential.

<<Circuit 10>>

The circuit 10 includes a circuit 11 and a circuit 12. The circuit 11 includes a pass transistor MS1 and a circuit 111. The circuit 12 includes a pass transistor MS2 and a circuit 112. Between a node a1 and a node a2, the pass transistor MS1 and the pass transistor MS2 are electrically connected in series in the circuit 10. Here, to maintain the logic level of the node a1 at a low level ("L"), VL1 is input to the node a1. VL1 may be 0 V or a ground potential (GND). The circuit 113 is electrically connected to the node a2. The circuit 111 is electrically connected to a gate of the pass transistor MS1, and the circuit 112 is electrically connected to a gate of the pass transistor MS2. The circuit 111 has a function of retaining data that determines the conduction state of the pass transistor MS1, and the circuit 112 has a function of retaining data that determines the conduction state of the pass transistor MS2.

<Circuit 111>

The circuit 111 is a data retention circuit of the memory circuit 100 and includes a node N1, a transistor MO1, and a capacitor C1. The circuit 111 is a one-transistor one-capacitor (1T1C) memory similar to a DRAM cell. Since the circuit 111 is capable of retaining an analog potential, it can also be referred to as an analog memory. The transistor MO1 is a pass transistor for electrically connecting the node N1 and a node to which a signal da1 (data signal) is input. A signal wr1 is input to a gate of the transistor MO1. The node N1 is a data retention node to which the signal da1 is written. The node N1 is electrically connected to the gate of the pass transistor MS1. The capacitor C1 is a storage capacitor that stores charge of the node N1. VL1 is applied to a terminal of the capacitor C1.

<Circuit 112>

The circuit 112 includes a node N2 and a transistor MO2. The transistor MO2 is a pass transistor for electrically connecting the node N2 and a node to which a signal da2 is input. A signal wr2 is input to a gate of the transistor MO2. The node N2 is electrically connected to the gate of the pass transistor MS2. Since the circuit 112 is capable of retaining an analog potential in a manner similar to that of the circuit 111, it can also be referred to as an analog memory. In the circuit 112, a charge storage capacitance of the node N2 serves as a parasitic capacitance of the node N2 (e.g., a gate capacitance of the pass transistor MS2). Like in the circuit 111, a capacitor connected to the node N2 may be intentionally provided in the circuit 112. Meanwhile, it is possible not to provide the capacitor C1 in the circuit 111.

Since the circuit 111 and the circuit 112 each can function as an analog memory, the circuit 11 and the circuit 12 can each be referred to as an analog memory built-in pass transistor (APT), and the circuit 10 can be also referred to as a circuit including analog memory built-in pass transistors (APTs).

(Transistors MO1 and MO2)

In the circuit 111, the transistor MO1 is turned off, whereby the node N1 is brought into an electrically floating state and thus the circuit 111 is brought into a data retention state. Note that to extend the data retention period of the circuit 111, the transistor MO1 is preferably a transistor with an extremely low off-state current. This is because as the off-state current of the transistor MO1 becomes lower, a change in the potential of the node N1 in a floating state is reduced. For the same reason, in the circuit 112, the transistor MO2 is preferably a transistor with an extremely low off-state current.

Extremely low off-state current means, for example, that off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm), more preferably lower than or equal to 10 yA/μm (y represents yocto and denotes a factor of $10^{-24}$).

In order to make the off-state current of the transistor extremely low, a channel of the transistor is formed in a semiconductor with a wide bandgap, for example, a semiconductor with a bandgap of greater than or equal to 3.0 eV. As an example of such a semiconductor, an oxide semiconductor containing a metal oxide can be given. A transistor with an oxide semiconductor layer in which a channel is formed (hereinafter also referred to as an OS transistor) has low leakage current due to thermal excitation and extremely low off-state current.

An off-state current refers to a current that flows between a source and a drain when the transistor is off. For example, when the transistor is an n-channel transistor with a threshold voltage of approximately 0 V to 2 V, a current that flows between the source and the drain when a voltage between the gate and the source is negative can be referred to as an off-state current.

An oxide semiconductor of an OS transistor preferably contains at least one of indium (In) and zinc (Zn). Typical examples of the oxide semiconductor of the OS transistor include In—Ga—Zn oxide and In—Sn—Zn oxide. By reducing impurities serving as electron donors, such as moisture or hydrogen, and also reducing oxygen vacancies, an i-type (intrinsic) or a substantially i-type oxide semiconductor can be obtained. Here, such an oxide semiconductor is referred to as a highly purified oxide semiconductor. By forming the channel using a highly purified oxide semiconductor, the off-state current of the OS transistor that is normalized by channel width can be as low as several yoctoamperes per micrometer to several zeptoamperes per micrometer. The oxide semiconductor and the OS transistor are described in more detail in Embodiment 3.

<Circuit 113>

The circuit 113 has a function of supplying a high-level potential ("H") to the node a2 of the memory circuit 100. The circuit 113 includes a transistor MD2 and a circuit 114. The circuit 114 includes a transistor MD1 and an inverter INV1. An output logic of the circuit 113 is determined by the conduction state between the pass transistor MS1 and the pass transistor MS2 of the circuit 10. The circuit 114 has a function of maintaining "H" of the node a2 that has been precharged. The transistor MD2 is a pass transistor for electrically connecting the node a2 and a node to which the potential VH1 is supplied and has a function of precharging the node a2 to a high level ("H"). A signal wr3 is input to a gate of the transistor MD2. While the transistor MD2 is on, the node a2 is at "H", and thus the logic level of an output node is maintained at "L". Thus, the circuit 113 is a kind of dynamic logic circuit.

A period during which the transistor MD2 is on is a precharge period, in which the node a2 is charged with VH1. A period during which the transistor MD2 is off is an evaluation period, in which whether the node a2 remains at an electrically floating state and the potential level thereof is maintained at "H", or the potential level is changed to "L" owing to discharge is determined by on or off of the pass transistors MS1 and MS2.

<Operation Example>

Figure 2A:
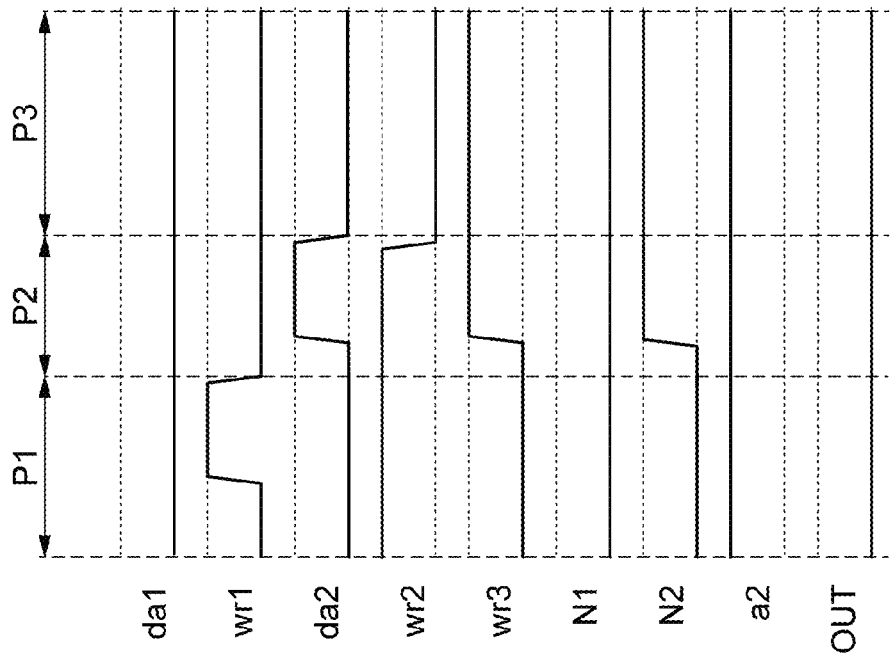
FIGS. 2A and 2B are timing charts showing operation examples of a memory circuit.
Figure 2B:
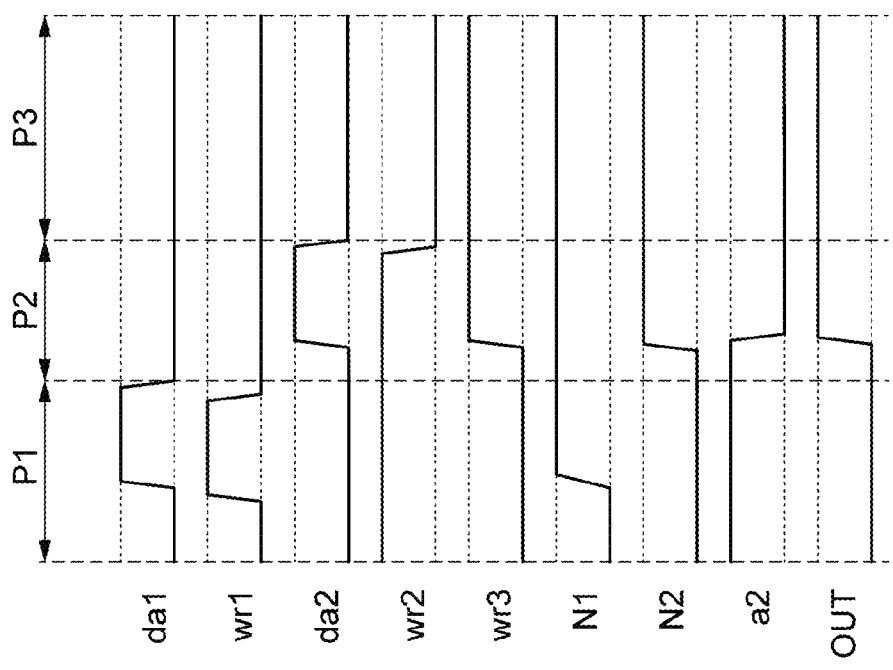

FIGS. 2A and 2B each show an example of a timing chart of the memory circuit 100. The memory circuit 100 has a function of retaining the signal da1, which is configuration data, and outputting a fixed potential that depends on the configuration data. FIG. 2A shows an example in which "H" is written to the node N1, and FIG. 2B shows an example in which "L" is written to the node N1.

Period P1 is a writing period of the circuit 111. The signal wr2 is at "H", and thus the transistor MO2 is on. First, data is written to the circuit 111. At this time, the signal wr3 is set at "L", whereby the transistor MD2 is turned on. That is, the node a2 is set at "H", and the output node is set at "L". The signal wr1 is set at "H" and then the transistor MO1 is turned on, whereby the signal da1 is written to the node N1. The node N1 is set at "H" in the example of FIG. 2A, and set at "L" in the example of FIG. 2B. The transistor MO1 is turned off, that is, the node N1 becomes a floating node, whereby the charge of the node N1 is retained. Therefore, the circuit 111 is brought into a data retention state.

Period P2 is a writing period of the circuit 112. The signal wr3 is set at "H", whereby the transistor MD2 is turned off. At this time, the potential level of the node N2 is changed from "L" to "H". Therefore, in the example of FIG. 2A, both the pass transistors MS1 and MS2 are brought into a conduction state, so that the node a2 and the node a1 are electrically connected to each other. As a result, the node a2 is set at "L" (VL1) owing to VL1 which is supplied to the node a1. Thus, the output node is set at "H". Meanwhile, in the example of FIG. 2B, although the potential level of the node N2 is changed from "L" to "H", since the potential retained by the node N1 is "L", the pass transistor MS1 is in a non-conduction state. Thus, the node a2 and the node a1 are not electrically connected to each other; therefore, the node a2 is maintained at "H" owing to the circuit 114, and the output node is maintained at "L". The signal wr2 is set at "L" and the transistor MO2 is turned off, whereby the node N2 becomes a floating node and the charge of the node N1 is retained. Therefore, the circuit 112 is brought into a data retention state.

Period P3 is a data output period. A signal which has a logic that depends on the potential of the node N1 is output from the output node. The signal wr1, the signal wr2, and the signal wr3 are maintained at "L", "L", and "H", respectively, whereby the transistors MO1, MO2, and MD2 remain in the off state. A signal at "H" is output from the output node in the example of FIG. 2A, and a signal at "L" is output from the output node in the example of FIG. 2B.

The circuit 111 and the circuit 112 are nonvolatile memory circuits owing to the extremely low off-state current of OS transistors and do not need electrical power in order to retain data. In Period P3, since the circuits 111 and 112 are in a state for retaining data, driver circuits that supply signals to the circuits 111 and 112 need not operate. Therefore, power supply to the driver circuits can be stopped by power gating. The above structure makes it possible to reduce the power consumption of a semiconductor device including the memory circuit 100. For example, in such a semiconductor device, while a combinational circuit which is electrically connected to the output node processes data which has been read from the memory circuit 100, power control such that power supply to the circuit 111, the circuit 112, and driver circuits thereof is stopped by power gating may be performed.

Note that in a memory circuit that utilizes an extremely low off-state current of a transistor including an oxide semiconductor layer in a channel portion, a predetermined voltage might keep being supplied to the transistor in a period for retaining data. For example, a voltage that turns off the transistor completely might keep being supplied to a gate of the transistor. Alternatively, a voltage that shifts the threshold voltage of the transistor to make the transistor in a normally-off state may keep being supplied to a back gate of the transistor. In these cases, the voltage is supplied to the memory circuit in the period for retaining data. However, because almost no current flows, little power is consumed. Because of little power consumption, even if the predetermined voltage is supplied to the memory circuit, the memory circuit can be regarded as being substantially nonvolatile.

The memory circuit 100 illustrated in FIG. 1 can be used as a circuit for retaining data that is to be processed by a combinational circuit (e.g., a look-up table or a multiplexer) and can be used in a variety of processing devices. For example, the memory circuit 100 can be used in a configuration memory that stores configuration data of a programmable logic device (PLD).

A PLD includes a programmable logic element (PLE, also referred to as a logic block) and a programmable switch circuit which controls a conduction state with another PLE. The PLE includes a combinational circuit such as a look-up table (LUT) or a multiplexer.

The circuit configuration of the PLD can be changed by change in the connection state of the switch circuit or the circuit configuration of the PLE. Furthermore, the function of the PLD can be changed by change in logic which is processed by the PLE. Data for setting the connection state or the logic is referred to as configuration data, and a memory circuit for storing the configuration data is referred to as a configuration memory. Storing of the configuration data in the configuration memory is referred to as configuration. In particular, rewrite (refresh) of the configuration data stored in the configuration memory is referred to as reconfiguration. The PLD can be set to have a circuit configuration suitable for a user's request by producing (programming) desired configuration data and performing the configuration.

Figure 3:
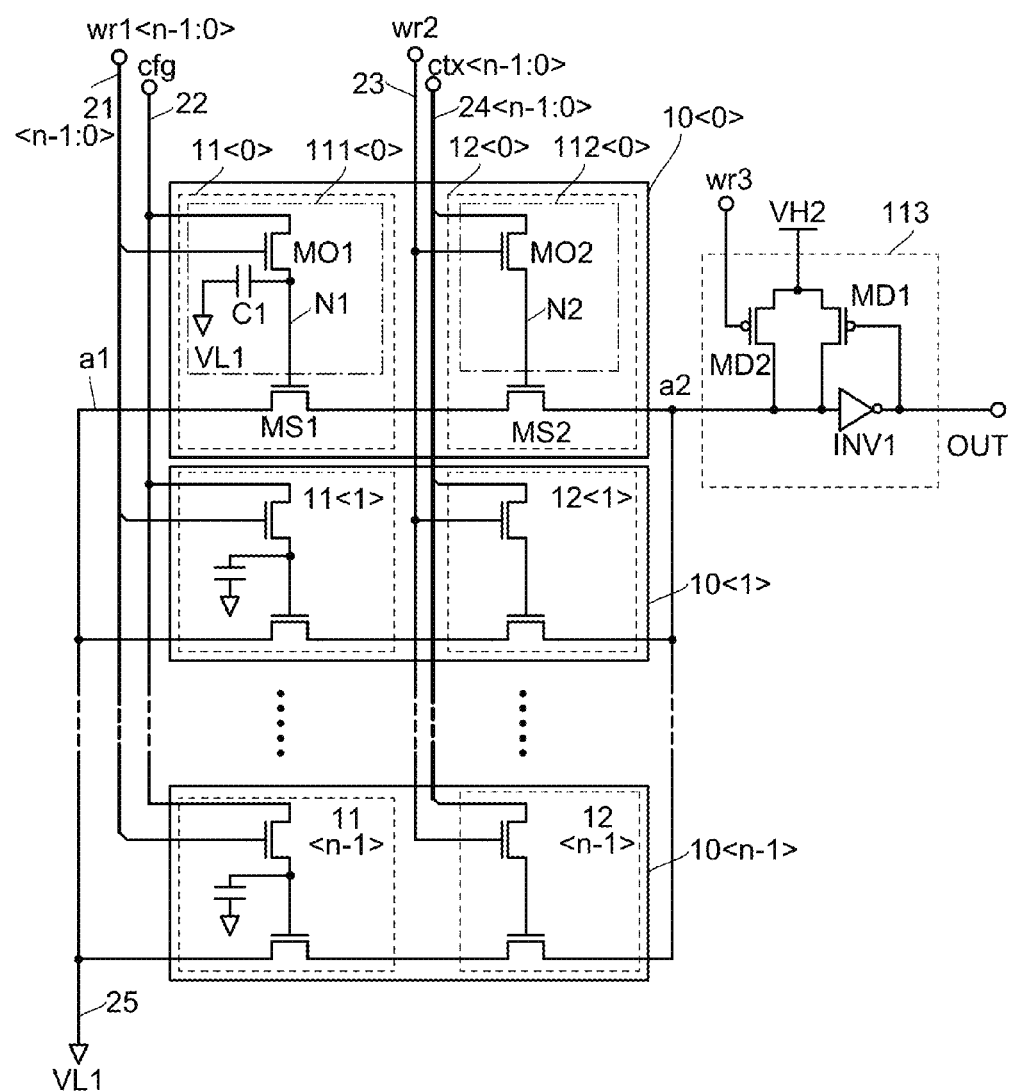
FIG. 3 is a circuit diagram illustrating a configuration example of a memory circuit.

A multi-context PLD (MC-PLD) includes a configuration memory capable of storing sets of configuration data. The configuration of the MC-PLD can be changed quickly only by switching the sets of configuration data to be loaded. Furthermore, the MC-PLD can perform dynamic configuration, in which a set of configuration data which is not selected can be rewritten during execution of processing. The use of the memory circuit 100 makes it possible to obtain a configuration memory that is usable for multi-context (such a memory is referred to as an MC configuration memory in the following description). FIG. 3 illustrates an example of such a memory circuit.

<<Configuration Example 2 of Memory Circuit>>

A memory circuit 101 illustrated in FIG. 3 is a modification example of the memory circuit 100 and includes n (n is an integer greater than or equal to 2) circuits 10, the circuit 113, n wirings 21, a wiring 22, a wiring 23, and n wirings 24. The operations and functions of the circuits 111 to 113 in the memory circuit 101 are the same as those of the circuits 111 to 113 in the memory circuit 100.

The node a1 is electrically connected to a wiring 25. The wiring 25 has a function of supplying the potential VL1. The node a2 is electrically connected to the circuit 113. Signals wr1<0> to wr1<n−1> are input to the wirings 21<0> to 21<n−1>, respectively. A signal cfg is input to the wiring 22. The signal wr2 is input to the wiring 23. Signals ctx<0> to ctx<n−1> are input to the wirings 24<0> to 24<n−1>, respectively. Note that the signals ctx<0> to ctx<n−1> may be represented as signals ctx<n−1:0>. The same applied to the other signals, the circuit 10, and the like.

The circuits 10<0> to 10<n−1> are electrically connected in parallel between the node a1 and the node a2. The circuit 10<j> includes a circuit 11<j> and a circuit 12<j> (j is an integer greater than or equal to 0 and less than or equal to n−1). The circuit 11<j> includes a pass transistor MS1 and a circuit 111<j> and is electrically connected to the wiring 21<j> and the wiring 22. The circuit 12<j> includes a pass transistor MS2 and a circuit 112<j> and is electrically connected to the wiring 23 and the wiring 24<j>. Circuits 11<n−1:0> form a memory circuit capable of storing n pieces of configuration data. The signal cfg can function as a configuration data signal. Circuits 12<n−1:0> select the circuit 11<j> to which configuration data is to be output. In this manner, the n circuits 12 form a selector for selecting a context.

Accordingly, when a context function is not needed, each of the circuits 10 may have a circuit configuration without the circuit 12.

<Operation Example>

Figure 4:
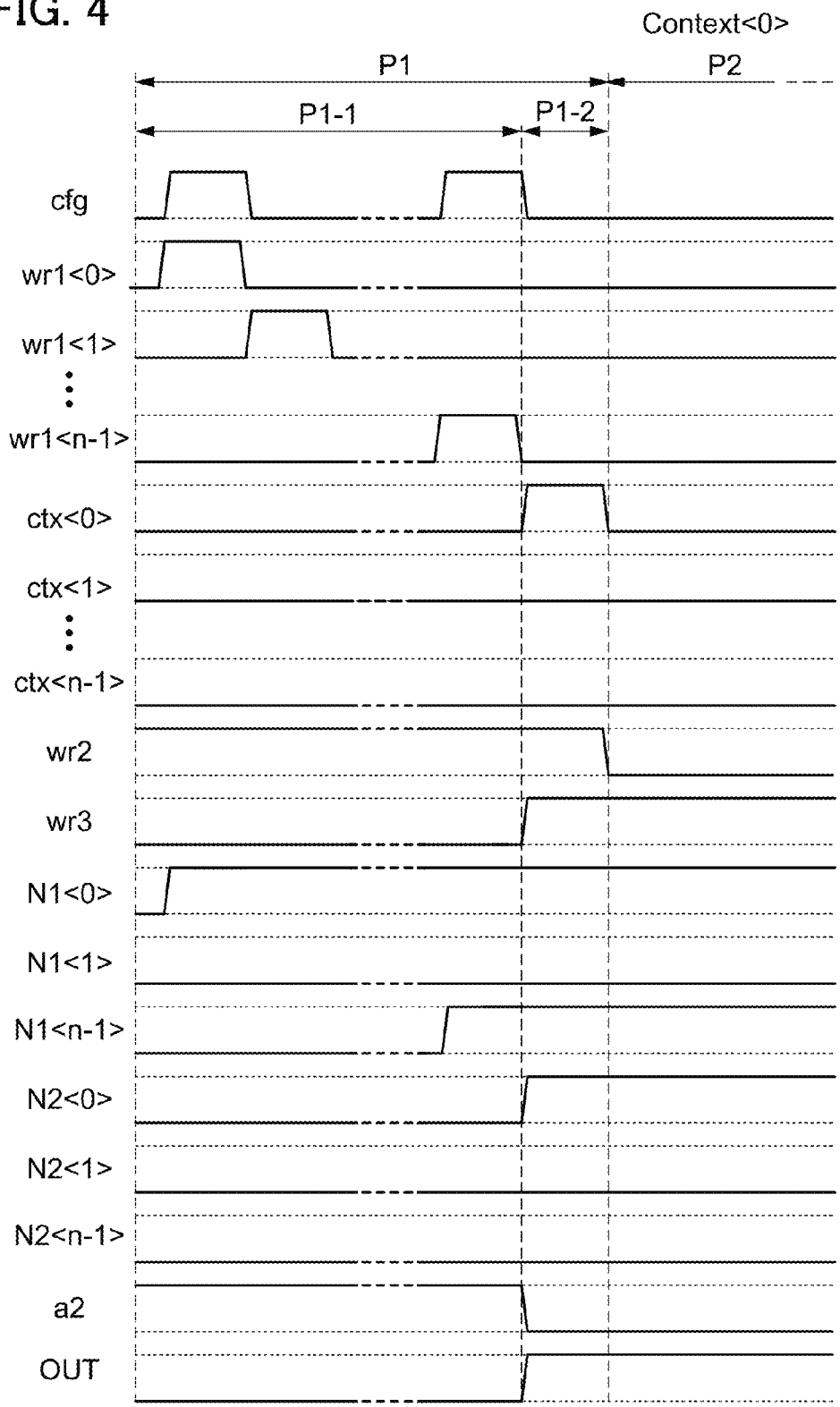
FIG. 4 is a timing chart showing an operation example of a memory circuit.
Figure 5:
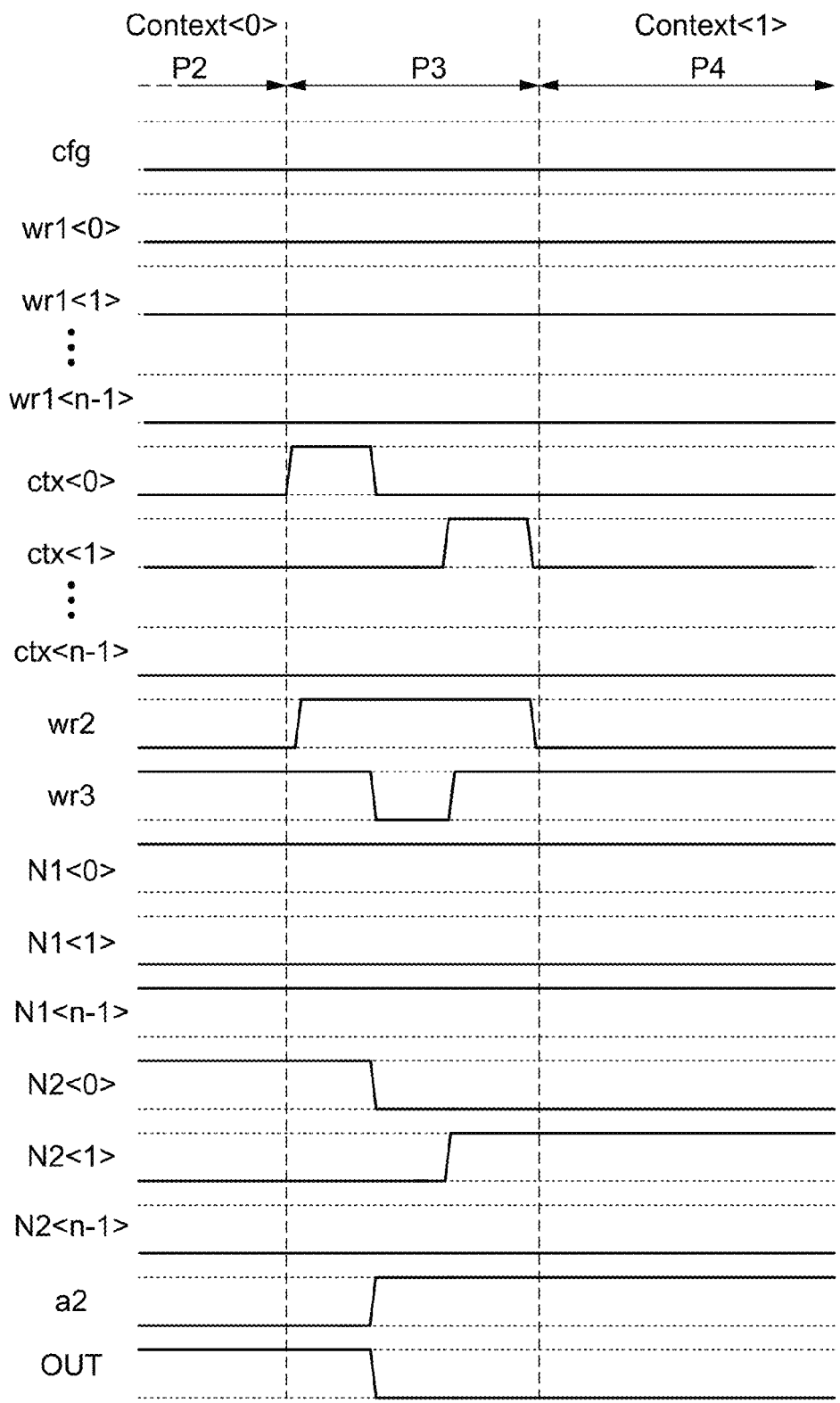
FIG. 5 is a timing chart showing an operation example of a memory circuit.

FIG. 4 and FIG. 5 each show an operation example of the memory circuit 101. Here, the signal cfg is a configuration data signal and has a function of selecting a context. Only the signal ctx<j> of the signals ctx<n−1:0> is set at "H", whereby the pass transistor MS2 of the circuit 112<j> of an address number/(row number) is turned on, so that a logic which depends on the configuration data stored in the circuit 111<j> is output from the output node. Hereinafter, such a state may be expressed as selecting Context <j>.

A configuration operation is performed in Period P1. In Period P1-1, the transistor MD2 is turned on and the potential of the node a2 is precharged with VH2. VH2 is a high power supply potential. That is, in Period P1-1, the logic level of the node a2 is set at "H", whereby the output node is fixed at "L". The signals wr1<n−1:0> are sequentially set at "H", the signal wr2 is set at "H", and the signal cfg is written to the circuits 11<0> to 11<n−1>. Here, configuration data at "H" is written to the nodes N1<0> and N1<n−1> and configuration data at "L" is written to the other nodes N1. In Period P1-2, the signal wr3 is set at "H", whereby the transistor MD2 is turned off. The signal wr2 is set at "H" to write the signals ctx<n−1:0> to the circuits 12<n−1:0>. Here, to select Context <0>, only the signal ctx<0> is at "H", and the other signals ctx<n−1:1> are at "L".

In Period P2, an operation for reading data is performed. That is, Period P2 is a period during which the PLD including the memory circuit 101 performs a normal operation. Since Context <0> is selected, the configuration data of the circuit 11<0> is output. The node N1<0> is at "H"; therefore, the pass transistor MS1 of the circuit 11<0> and the pass transistor MS2 of the circuit 12<0> are on, and thus the potential of the node a2 is at "L". Accordingly, a signal at "H" is output from the output node.

In Period P3, an operation for switching the context is performed. In the example of FIG. 5, to switch the context from Context <0> to Context <1>, context data of the circuits 12<0> to 12<n−1> is rewritten. First, the signals ctx<n−1:0> having the same logic levels as those in Period P1-2 are input. Then, the signal wr2 is set at "H". Next, the signal wr3 is set at "L", whereby the transistor MD2 is turned on. The signals ctx<n−1:0> are set at "L", whereby the pass transistors MS2 of the circuits 12<0> to 12<n−1> are turned off, inhibiting a shoot-through current between the node a1 and the node a2. The signal wr3 is set at "H", whereby the transistor MD2 is turned off. Furthermore, the signal ctx<1> is set at "H" and the other signals ctx are set at "L", so that "H" and "L" are supplied to the node N2<1> and the other nodes N2, respectively.

In Period P4, Context <1> is selected. Since the node N1<1> is at "L", the node a2 is maintained at "H". Accordingly, a signal at "L" is output from the output node.

Since the memory circuits 100 and 101 are pass-transistor-based circuits, they each can retain a piece of data with a smaller number of elements than those of an SRAM. Thus, the size of a semiconductor device including the memory circuit 100 or 101 can be small, and the power consumption thereof can be reduced. Furthermore, to retain a piece of data, an inverted data signal of the data needs to be written in the memory cell in an SRAM; however, the memory circuits 100 and 101 do not need such an operation. Therefore, it is possible to simplify the configurations of the writing circuits and the reading circuits of the memory circuits 100 and 101.

<<Configuration Example of Switch Circuit>>

The circuit 10 illustrated in FIG. 1 can be used as a programmable switch circuit. Examples of such a switch circuit are shown in FIG. 6, FIG. 7, and FIG. 8.

Figure 6:
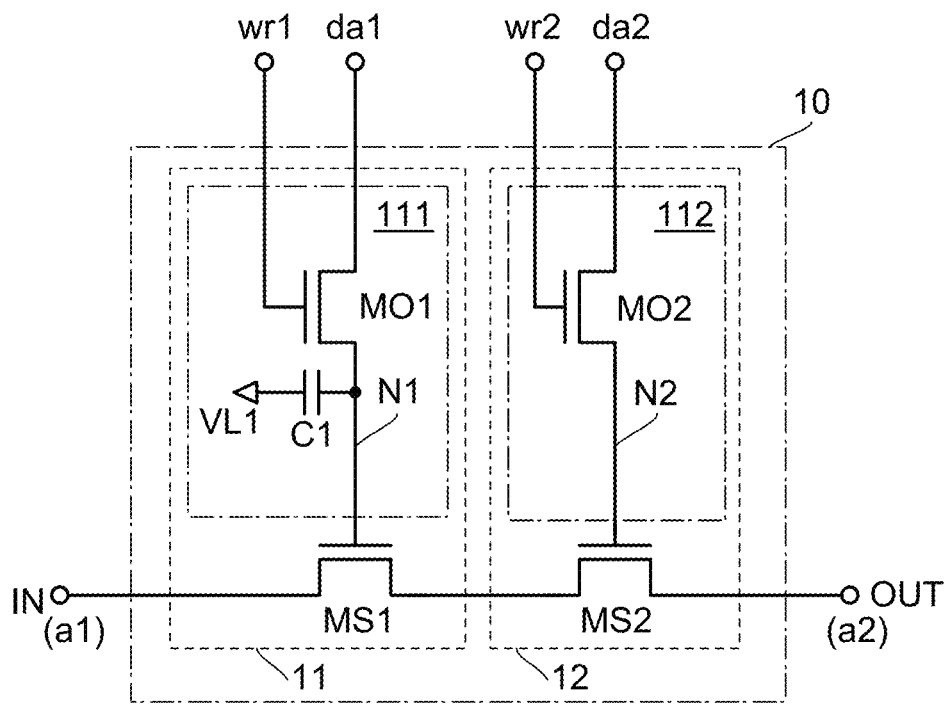
FIG. 6 is a circuit diagram illustrating a configuration example of a switch circuit.

A switch circuit 120 in FIG. 6 is composed of the circuit 10 in FIG. 1, in which an input node IN corresponds to the node a1 and an output node OUT corresponds to the node a2.

Figure 7:
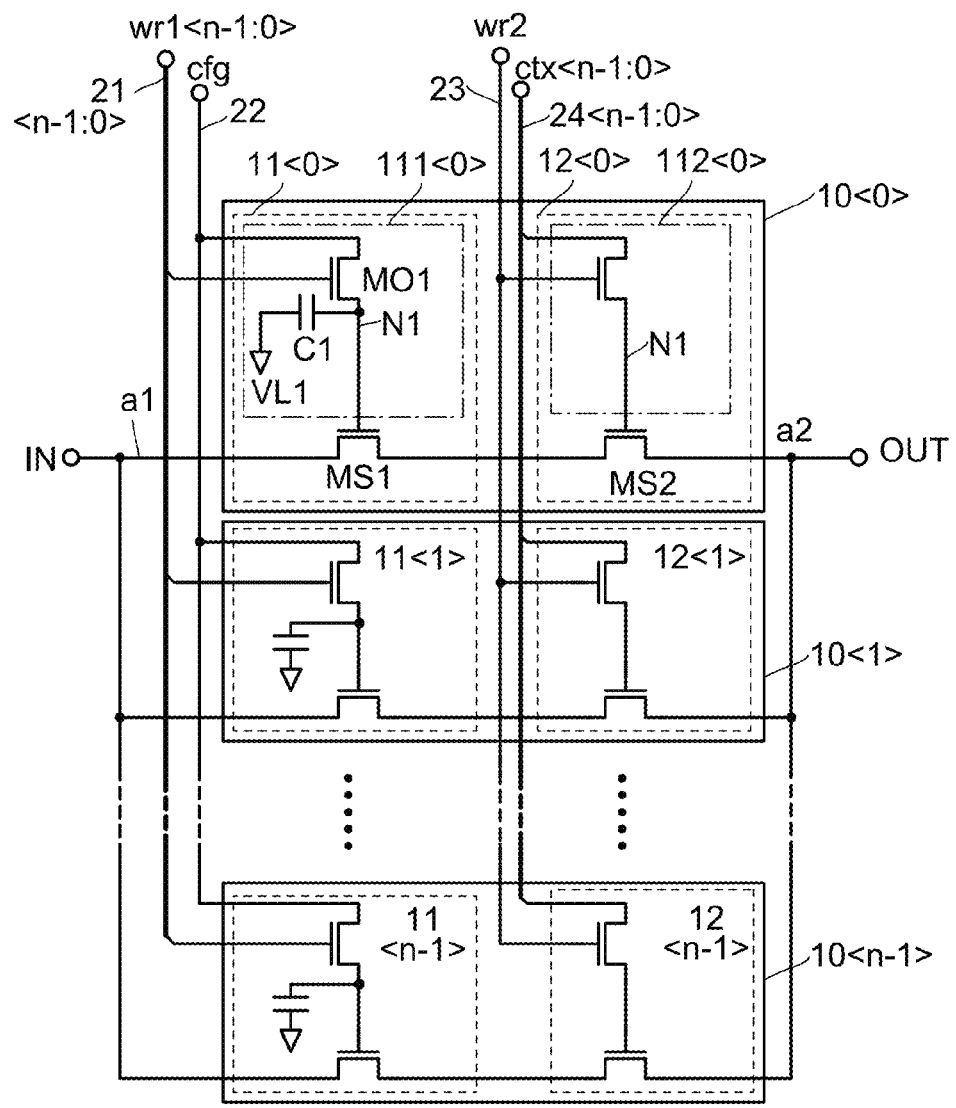
FIG. 7 is a circuit diagram illustrating a configuration example of a switch circuit.

A switch circuit 121 in FIG. 7 is composed of n circuits 10, corresponding to the memory circuit 101 from which the circuit 113 is removed. The switch circuit 121 is usable for multi-context. The pass transistor MS2 of one of the n circuits 10 is turned on, and the conduction state of the pass transistor MS1 of the circuit 10 determines the connection state between the input node IN and the output node OUT.

Figure 8:
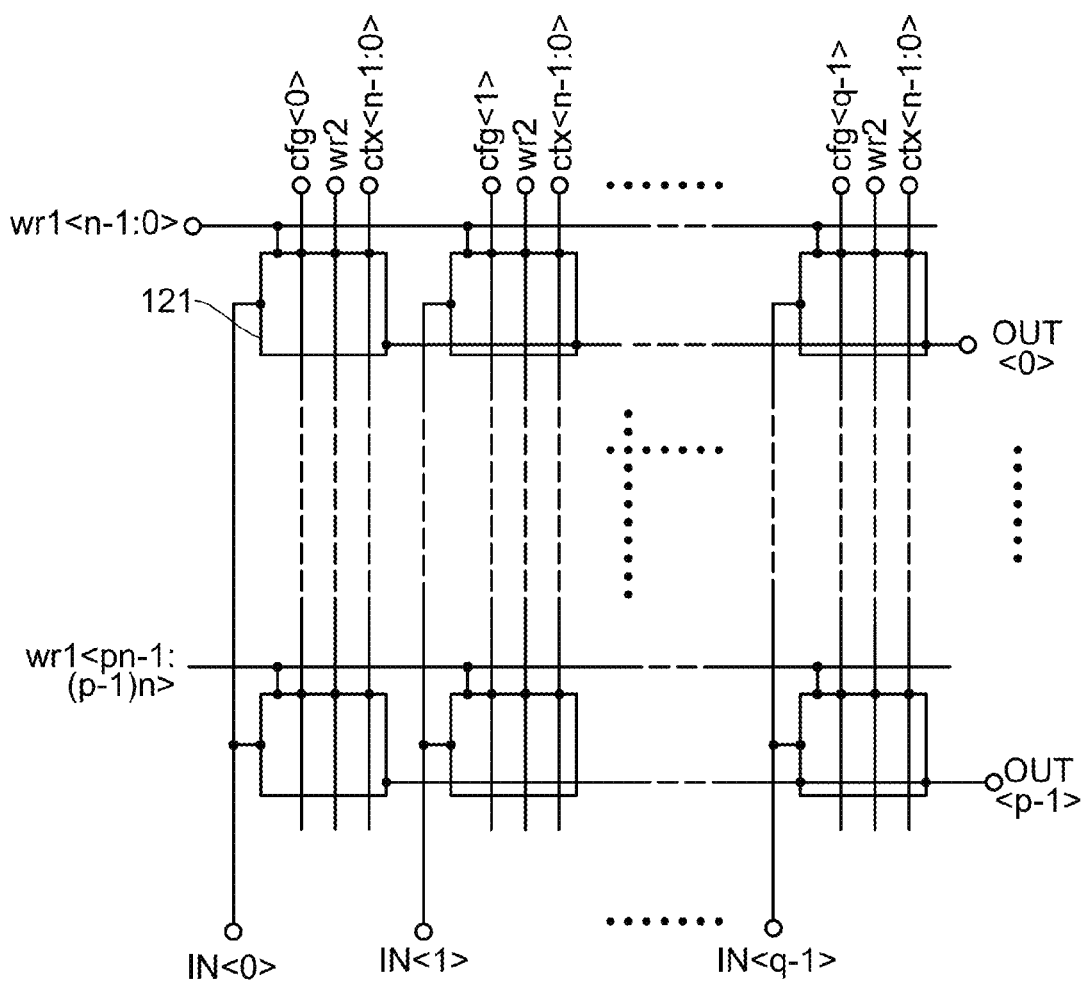
FIG. 8 is a block diagram illustrating a configuration example of a switch circuit.

A switch circuit 122 in FIG. 8 includes a plurality of switch circuits 121. The switch circuits 121 are arranged in an array of p rows and q columns (p and q are each an integer greater than or equal to 2). An input node IN<j> (j is an integer greater than or equal to 0 and less than or equal to q−1) is electrically connected to output nodes OUT<0> to OUT<p−1> via p switch circuits 121 provided in the j-th column. Note that the conduction state of each switch circuit 121 depends on configuration data.

<<Configuration Example of PLD>>

Figure 9:
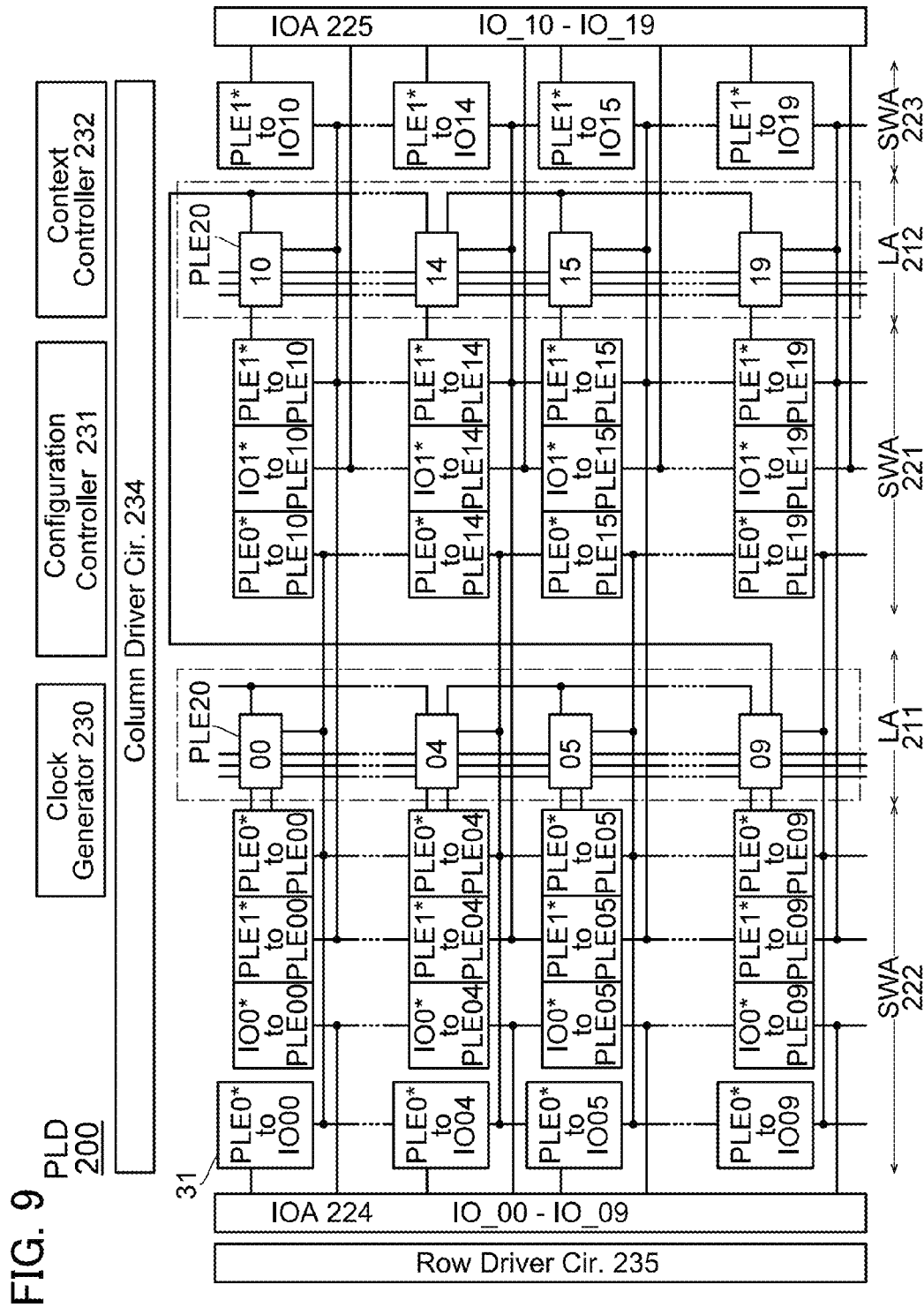
FIG. 9 is a block diagram illustrating a configuration example of a PLD.

FIG. 9 illustrates a configuration example of a multi-context PLD. A PLD 200 in FIG. 9 includes a logic unit, an input/output unit, and a peripheral circuit. The logic unit includes logic arrays (LAs) 211 and 212, and switching arrays (SWAs) 221 to 223. The input/output unit includes input/output arrays (IOAs) 224 and 225. The peripheral circuit includes functional circuits for driving the logic unit and the input/output unit. For example, the peripheral circuit includes a clock generator 230, a configuration controller 231, a context controller 232, a column driver circuit 234, and a row driver circuit 235.

The LAs 211 and 212 each include a plurality of programmable logic elements (PLEs) 20. In the example of FIG. 9, the LA 211 includes 10 PLEs 20 (PLE_00 to PLE_09), and the LA 212 includes 10 PLEs 20 (PLE_10 to PLE_19). The IOAs 224 and 225 have a function of controlling input and output of signals between external terminals of the PLD 200 and the LAs 211 and 212. The IOAs 224 and 225 each include a plurality of input/output circuits (IOs) which are electrically connected to respective external terminals. In the example of FIG. 9, the IOA 224 includes 10 input/output circuits (IO_00 to IO_09), and the IOA 225 includes 10 input/output circuits (IO_10 to IO_19).

The switch circuit 122 in FIG. 8 is used as each of the SWAs 221 to 223. The SWAs 221 to 223 each include a plurality of switch circuits 31. The expression in each switch circuit 31 represents the function of the switch circuit 31. For example, a switch circuit 31 expressed as "PLE0* to IO00" is a switch for controlling the conduction state between the output nodes of PLE_00 to PLE_09 and the input node of IO_00, and determines electrical connection between PLE_00 to PLE_09 and IO_00 on the basis of configuration data and context data.

The clock generator 230 has a function of generating one or more clock signals used in the PLD 200, from a clock signal input from the outside. The column driver circuit 234 has a function of generating the signal cfg. The row driver circuit 235 has a function of generating the signal wr1. The configuration controller 231 has a function of controlling the column driver circuit 234 and the row driver circuit 235. The context controller 232 has a function of controlling writing and rewriting of context data. The context controller 232 has a function of generating the signal wr2, the signal ctx, and the signal wr3.

<<Configuration Example of PLE>>

Figure 10:
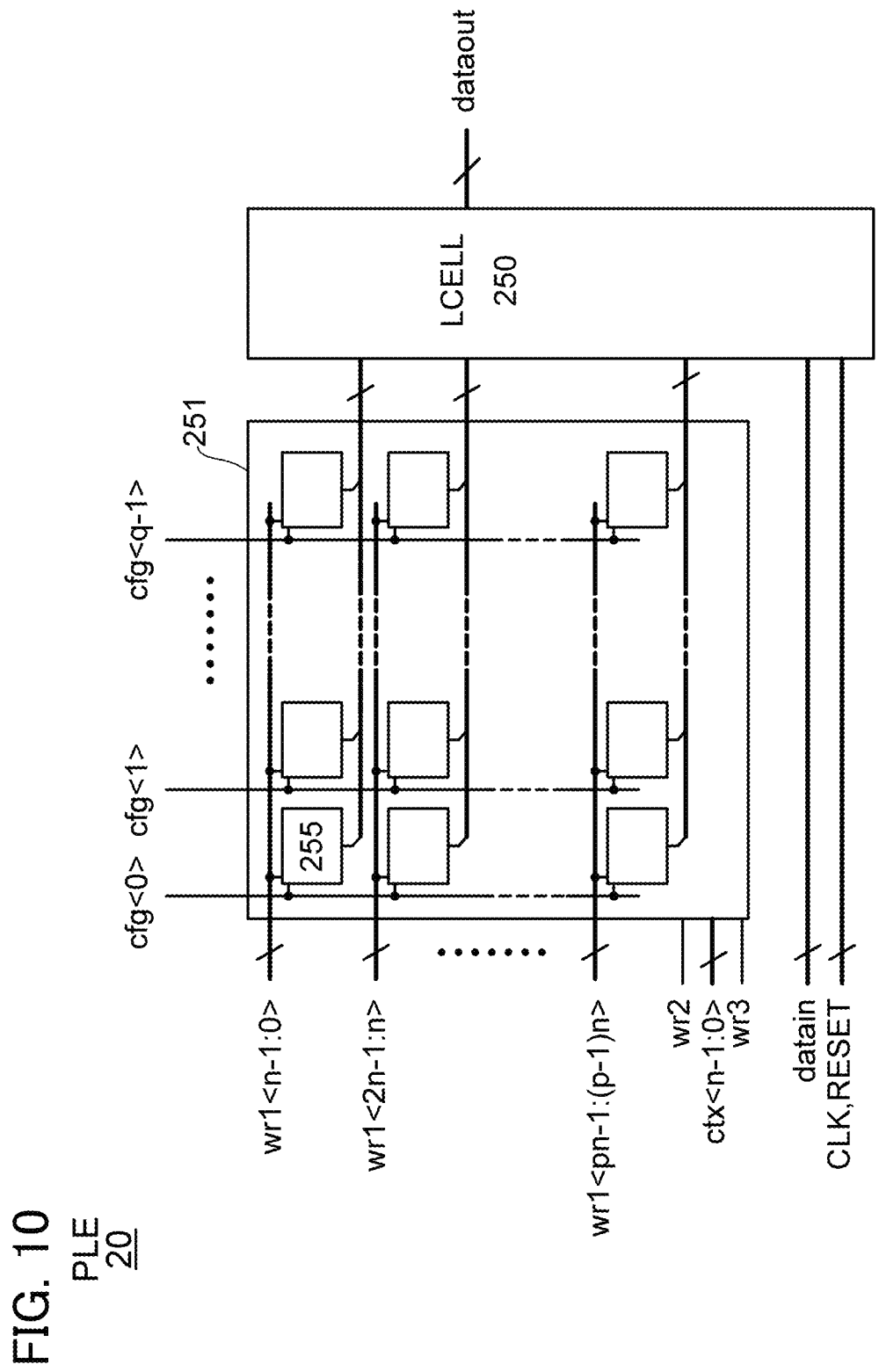
FIG. 10 is a block diagram illustrating a configuration example of a PLE.

FIG. 10 illustrates a configuration example of the PLE 20. The PLE 20 is a programmable logic circuit which includes a logic cell (LCELL) 250 and a configuration memory unit 251. A function of the LCELL 250 is determined by configuration data which is output from the configuration memory unit 251. The LCELL 250 has a function of generating a signal dataout which depends on the logic of a data signal datain. Control signals such as a clock signal CLK and a reset signal RESET are input to the LCELL 250.

The configuration memory unit 251 includes a plurality of memory circuits 255. The memory circuits 255 are each composed of the memory circuit 101 in FIG. 3. Here, the memory circuits 255 are arranged in an array of p rows and q columns (p and q are each an integer greater than or equal to 2). Signals wr1<jn−1:(j−1)n> and a signal cfg<k−1> are input to the memory circuit 255 provided in the j-th row and the k-th column. Here, j is an integer greater than or equal to 1 and less than or equal to p, and k is an integer greater than or equal to 1 and less than or equal to q. The signal wr3 for precharge, and the signals wr2 and ctx<n−1:0> for configuration are input to all the memory circuits 255 of the configuration memory unit 251.

<<Configuration Example of LCELL>>

Figure 11:
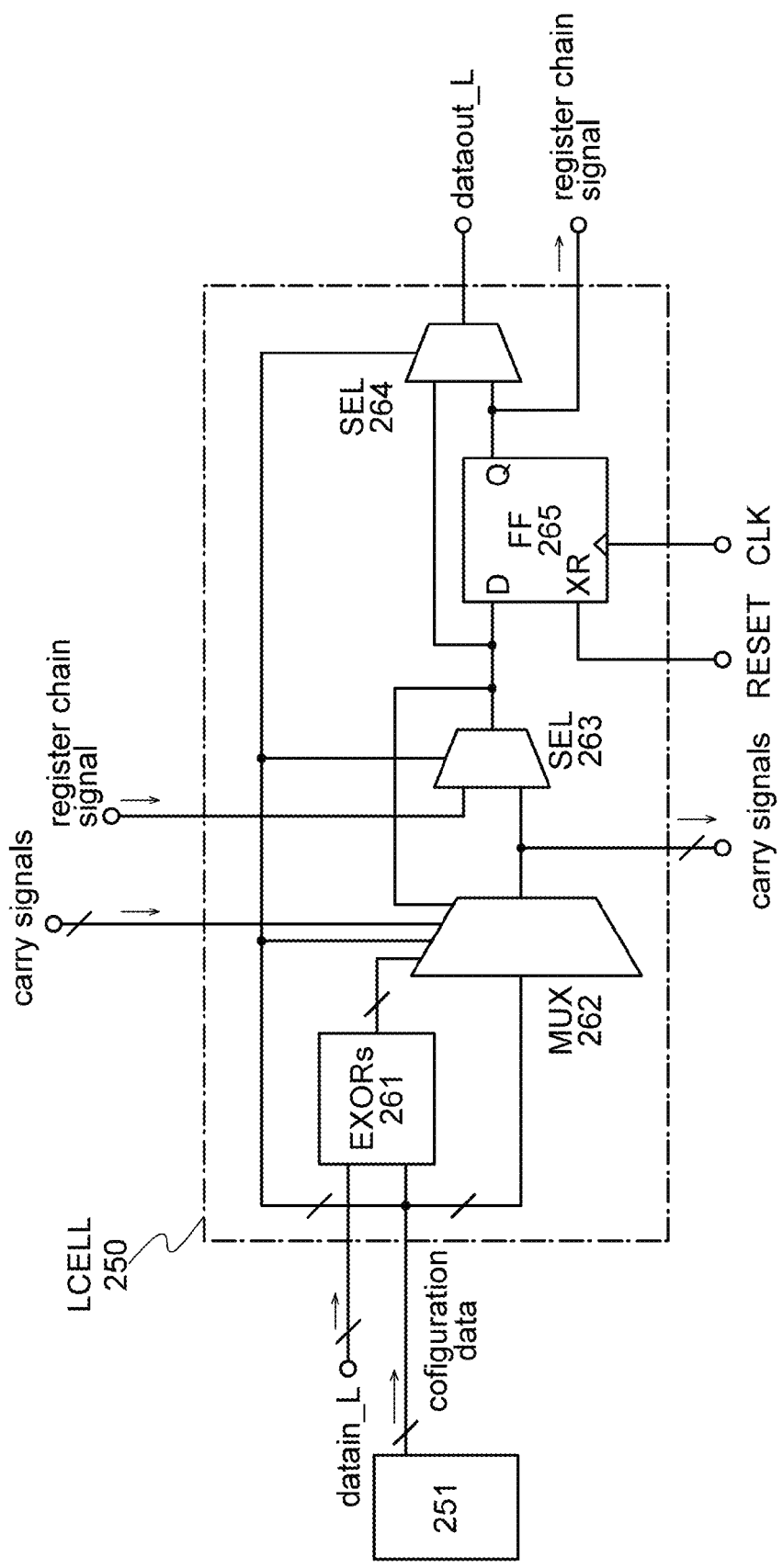
FIG. 11 is a circuit diagram illustrating a configuration example of an LCELL in a PLE.

FIG. 11 illustrates a configuration example of the LCELL 250. The LCELL 250 in FIG. 11 includes a plurality of logic circuits. For example, the LCELL 250 includes an exclusive OR circuit group (EXORs) 261, a multiplexer (MUX) 262, selectors (SELs) 263 and 264, and a flip-flop circuit (FF) 265. The FF 265 is a circuit functioning as a register. The FF 265 includes a terminal D to which data is input, a terminal XR to which the reset signal RESET is input, a terminal to which the clock signal CLK is input, and a terminal Q from which data is output. Logic functions of the combinational circuits (262 to 264) in the LCELL 250 are changed in accordance with configuration data output from the configuration memory unit 251.

A data signal datain_L is input to the LCELL 250 via a switch circuit 31. A data signal dataout_L is input to another switch circuit 31. In the case where a carry chain is formed with a plurality of LCELLs 250, input and output of carry signals are performed between the adjacent LCELLs 250. In the case where a register chain is formed with a plurality of LCELLs 250, input and output of register chain signals are performed between the adjacent LCELLs 250.

<<Device Structure of PLD>>

FIGS. 12A to 12C illustrate an example of a device structure of the PLD 200. FIG. 12A is a cross-sectional view for easy understanding of the layer structure, connection structure, and the like of the PLD 200, not a cross-sectional view of a circuit fabricated as the PLD 200 taken along a certain line. Here, the circuit 10 (FIG. 1) is illustrated as a typical example. The circuit 10 is a circuit which is provided in the switch circuits 31 and the memory circuits 255 of the PLE 20.

In FIG. 12A, regions where reference numerals and hatching patterns are not given show regions formed of an insulator. In these regions, an insulator containing one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, a resin such as a polyimide resin, a polyamide resin, an acrylic resin, a siloxane resin, an epoxy resin, or a phenol resin can be used.

Here, the pass transistors MS1 and MS2 are planar type transistors and provided on a semiconductor substrate 700. As the semiconductor substrate, a single crystal silicon wafer may be used, for example. A reference numeral 701 denotes an element isolation layer. The semiconductor of the semiconductor substrate 700 is not limited to silicon. The semiconductor substrate 700 may be a semiconductor substrate of a Group 14 element(s), such as germanium, silicon carbide, or silicon germanium; or a semiconductor substrate of a compound such as gallium nitride. The pass transistors MS1 and MS2 each include impurity regions 740, a conductive layer 741, a gate insulating layer 742, and sidewall insulating layers 743.

Moreover, the pass transistors MS1 and MS2 may be provided with an impurity region functioning as a lightly doped drain (LDD) region or an extension region under the sidewall insulating layer 743. In particular, when the pass transistors MS1 and MS2 are n-channel transistors, the LDD region or the extension region is preferably provided in order to suppress the deterioration due to hot carriers.

As each of the pass transistors MS1 and MS2, a transistor containing silicide (salicide) or a transistor which does not include the sidewall insulating layer 743 may be used. When a structure that contains silicide (salicide) is used, the resistance of the source region and the drain region can be further lowered and the operation speed of the semiconductor device can be increased. Furthermore, the semiconductor device can be operated at low voltage; thus, power consumption of the semiconductor device can be reduced.

Although the semiconductor substrate 700 is a balk semiconductor substrate here, it may be an SOI semiconductor substrate. Furthermore, a substrate supporting a semiconductor layer of the SOI semiconductor substrate may be a semiconductor substrate, an insulator substrate, or a conductor substrate. Examples of the insulating substrate include a glass substrate, a quartz substrate, and a plastic substrate. Examples of the conductor substrate include a metal substrate, a stainless steel substrate, a substrate including stainless steel foil, a tungsten substrate, and a substrate including tungsten foil. Alternatively, a flexible substrate (e.g., an attachment film, paper including a fibrous material, or a base film) may be used. Examples of the glass substrate include a barium borosilicate glass substrate, an aluminoborosilicate glass substrate, and a soda lime glass substrate. Examples of the flexible substrate include a flexible synthetic resin such as plastics typified by polyethylene terephthalate (PET), polyethylene naphthalate (PEN), and polyether sulfone (PES), and acrylic. Examples of the attachment film include attachment films formed using polypropylene, polyester, polyvinyl fluoride, and polyvinyl chloride. Examples of the base film include base films formed using polyester, polyamide, polyimide, aramid, epoxy, an inorganic vapor a deposition film, and paper.

Alternatively, a semiconductor element may be formed using the semiconductor substrate 700, and then, transferred to another substrate. Examples of a substrate to which a semiconductor element is transferred include, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester, or the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

A transistor MS70 illustrated in FIGS. 12B and 12C can be used as each of the pass transistors MS1 and MS2. FIG. 12C is a cross-sectional view taken along line E-F in FIG. 12B. The transistor MS70 includes a semiconductor layer 756 where a channel is formed, an impurity region 751, an impurity region 755, a gate insulating film 753, a gate electrode 752, sidewall insulating layers 754, and an element isolation layer 701. The semiconductor layer 756 has a protrusion, and the gate insulating film 753 and the gate electrode 752 are provided along top and side surfaces of the protrusion. The transistor having such a shape is also referred to as a FIN transistor because it utilizes a protruding portion of the semiconductor substrate. Note that an insulating film serving as a mask for forming the protruding portion may be provided in contact with the top of the protruding portion. Although the case where the protruding portion is formed by processing part of the semiconductor substrate 700 is described here, a semiconductor layer having a protrusion may be formed by processing an SOI semiconductor substrate.

An insulating layer 703 is provided to cover the pass transistors MS1 and MS2. The transistors MO1 and MO2 and the capacitor C1 are provided over the insulating layer 703. An insulating layer 704 covers the transistors MO1 and MO2 and the capacitor C1. The transistors MO1 and MO2 are each an OS transistor including an oxide semiconductor layer where a channel is formed. The details of the OS transistor are described in Embodiment 3. Here, the transistors MO1 and MO2 have the same device structure as an OS transistor 502 illustrated in FIG. 17A.

The insulating layers 703 and 704 preferably include at least one layer which is formed using an insulator that has a blocking effect against hydrogen, water, and the like. Water, hydrogen, and the like are factors that generate carriers in an oxide semiconductor layer; therefore, a blocking layer against hydrogen, water, and the like can improve the reliability of the transistors MO1 and MO2. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The transistors MO1 and MO2 and the capacitor C1 are provided over the insulating layer 703. An insulating layer 705 serves as gate insulating layers of the transistors MO1 and MO2 and a dielectric of the capacitor C1. The transistor MO1 includes an oxide semiconductor layer 710_1 and conductive layers 720 to 722. The transistor MO2 includes an oxide semiconductor layer 710_2 and conductive layers 724 to 726. The capacitor C1 includes the conductive layer 721 and a conductive layer 723. The oxide semiconductor layers 710_1 and 710_2 include oxide semiconductor layers 711 to 713.

The pass transistors MS1 and MS2, the transistors MO1 and MO2, and the capacitor C1 are wired with conductive layers 730 and 731 and plugs 732 to 734 so as to function as the circuit 10.

The conductive layers 720 to 726, 730, and 731 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductive layers are preferably formed using a Cu—Mn alloy, since in that case, manganese oxide formed at the interface with an insulator containing oxygen has a function of preventing Cu diffusion.

The plugs 732 to 734 preferably have a single-layer structure or a stacked-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material that has both heat resistance and conductivity, such as tungsten or molybdenum. In addition, the plugs are preferably formed using a low-resistance conductive material such as aluminum or copper. The plugs are preferably formed using a Cu—Mn alloy, since in that case, manganese oxide formed at the interface with an insulator containing oxygen has a function of preventing Cu diffusion.

In the example of FIG. 12A, the capacitor C1 is provided in the same layer as the transistors MO1 and MO2. The capacitor C1 may be stacked over the transistors MO1 and MO2. Alternatively, the capacitor C1 may be provided in a layer positioned between the transistors MO1 and MO2 and the pass transistors MS1 and MS2.

Embodiment 2

In this embodiment, examples in which the semiconductor device described in the above embodiment is used in an electronic component, examples in which the semiconductor device is used in an electronic device provided with the electronic component, and the like are described.

Figure 13A:
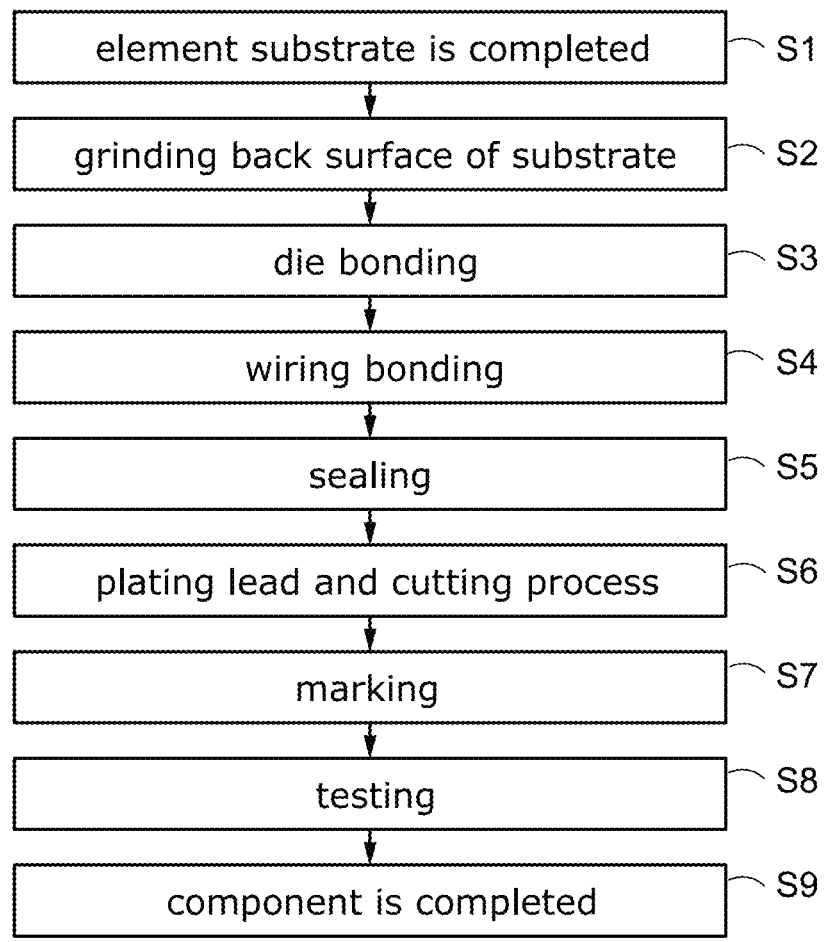
FIG. 13A is a flow chart showing an example of a manufacturing process of an electronic component.

FIG. 13A is a flow chart showing an example of a method for manufacturing a semiconductor device used in an electronic component. The electronic component is also referred to as a semiconductor package or an IC package. This electronic component has a plurality of standards and names depending on a terminal extraction direction and a terminal shape. Thus, examples of the electronic component are described in this embodiment.

A semiconductor device including a transistor can be completed after an assembly process (post-process) by using a plurality of components that can be detached and attached from and to a printed wiring board in combination. The post-process can be finished through the steps in FIG. 13A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed. A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability. Next, printing process (marking) is performed on a surface of the package (Step S7). Then, through a final test step (Step S8), the electronic component is completed (Step S9).

The electronic component can include the semiconductor device described in the above embodiment. Thus, the electronic component can consume less power and have a reduced size.

Figure 13B:
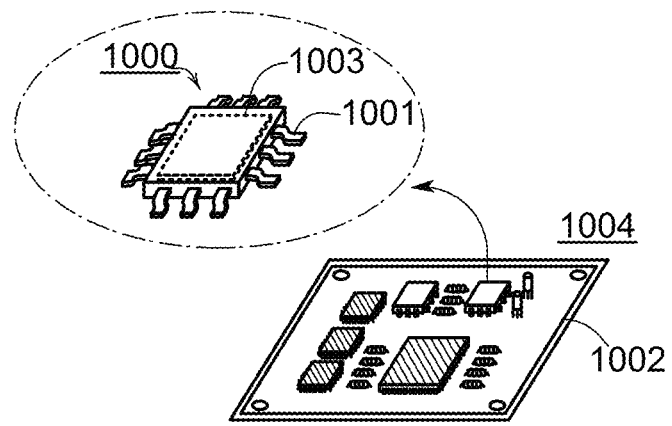
FIG. 13B is a schematic perspective view of an electronic component.

FIG. 13B is a schematic perspective view of the completed electronic component. FIG. 13B illustrates a schematic perspective view of a quad flat package (QFP) as an example of the electronic component. As illustrated in FIG. 13B, an electronic component 1000 includes a lead 1001 and a circuit portion 1003. The electronic component 1000 is mounted on a printed board 1002, for example. When a plurality of electronic components 1000 are used in combination and electrically connected to each other over the printed board 1002, the electronic components 1000 can be mounted on an electronic device. The completed circuit board 1004 is provided in an electronic device or the like.

The PLD of this embodiment itself, or a central processing unit (CPU), a microcontroller unit (MCU), a sensor device, or the like provided with the PLD can be used as a processor for executing various kinds of processing. An electronic component can be formed as a system-on-a-chip (SOC or SoC) in which the PLD and another circuit are mounted on one semiconductor chip (IC chip). In the case where the PLD is included in a sensor device, the sensor device is configured so that one PLD processes data detected by a plurality of sensors, whereby the electronic component can be reduced in size and can have multiple functions.

The dynamic power consumption of the semiconductor device of Embodiment 1 can be reduced, so that the power consumption of a processor of the electronic component including the semiconductor device can also be reduced. The processor can be used as processors of electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy. According to this embodiment, it is possible to reduce the size and power consumption of an electronic device.

Examples of the electronic device include display devices, personal computers, and image reproducing devices provided with recording media (devices that read image data of recording media such as digital versatile discs (DVDs) and have displays for displaying images). Other examples are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 14A to 14F illustrate specific examples of these electronic devices.

Figure 14A:
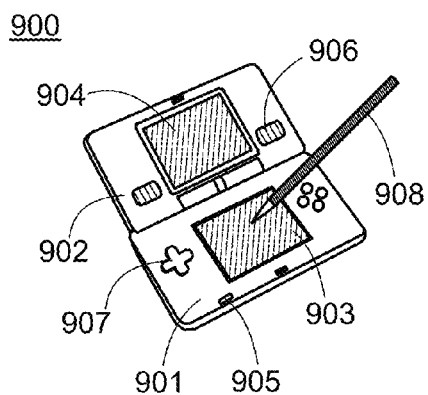
FIGS. 14A to 14F illustrate electronic devices using electronic components.

FIG. 14A illustrates a structure example of a portable game machine. A portable game machine 900 includes a housing 901, a housing 902, a display portion 903, a display portion 904, a microphone 905, a speaker 906, an operation key 907, a stylus 908, and the like.

Figure 14B:
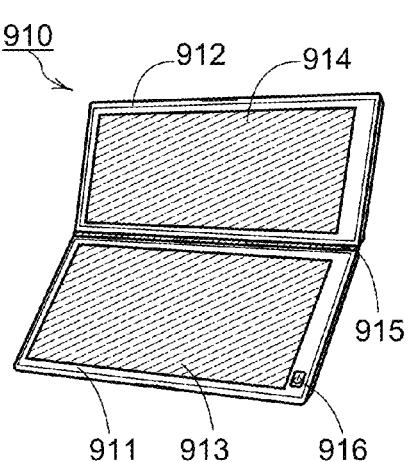

FIG. 14B illustrates a structure example of a portable information terminal. A portable information terminal 910 includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. Therefore, change in the direction of a displayed image on the display portion 913 or switching between display or non-display may be performed by changing the angle between the housings 911 and 912 connected with the joint 915. A display device with a touch panel may be used as the display portion 913 and/or the display portion 914.

Figure 14C:
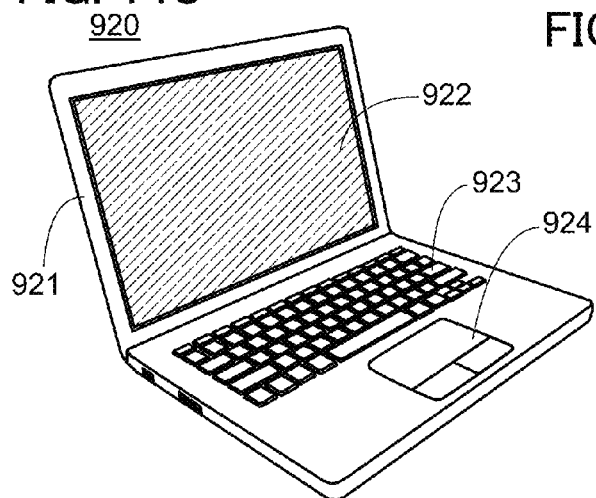

FIG. 14C illustrates a structure example of a laptop. The laptop 920 includes a housing 921, a display portion 922, a keyboard 923, a pointing device 924, and the like.

Figure 14D:
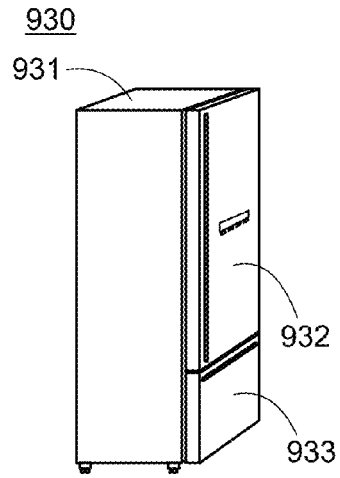

FIG. 14D shows an electric refrigerator-freezer as an example of a household appliance. The electric refrigerator-freezer 930 includes a housing 931, a refrigerator door 932, a freezer door 933, and the like.

Figure 14E:
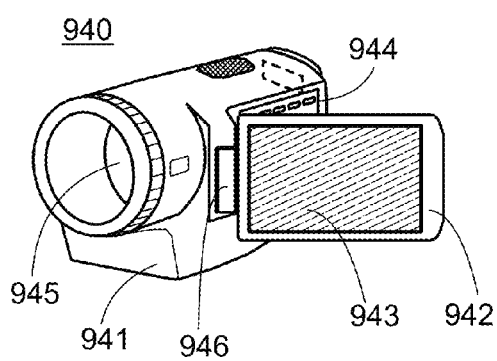

FIG. 14E illustrates a structure example of a video camera. A video camera 940 includes a housing 941, a housing 942, a display portion 943, operation keys 944, a lens 945, a joint 946, and the like. The operation keys 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. Change in the direction of a displayed image on the display portion 943 or selection between display and non-display of an image may be performed by changing the angle between the housings 941 and 942.

Figure 14F:
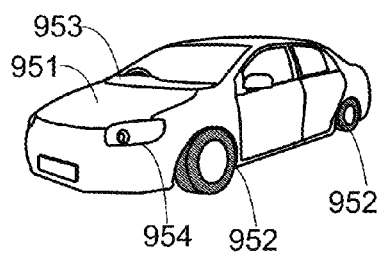

FIG. 14F is an external view illustrating a structure example of a motor vehicle. A motor vehicle 950 includes a car body 951, wheels 952, a dashboard 953, lights 954, and the like. The motor vehicle 950 may be engine-powered, or may be an electric vehicle or a hybrid vehicle.

Embodiment 3

In this embodiment, an oxide semiconductor, an OS transistor, and the like are described.

<<Structure Example 1 of OS Transistor>>

Figure 15A:
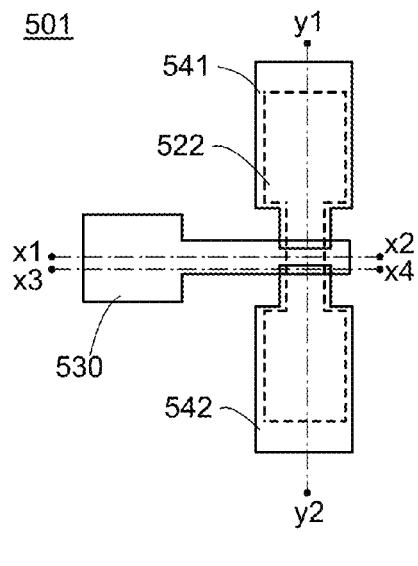
FIG. 15A is a plan view illustrating a structure example of an OS transistor.
Figure 15B:
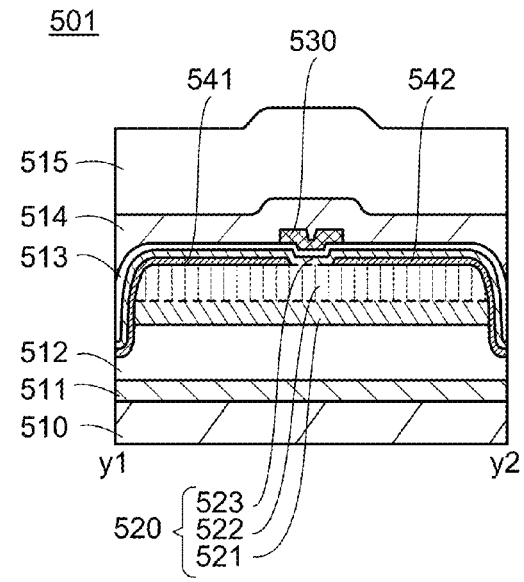
FIGS. 15B to 15D are cross-sectional views of FIG. 15A.
Figure 15C:
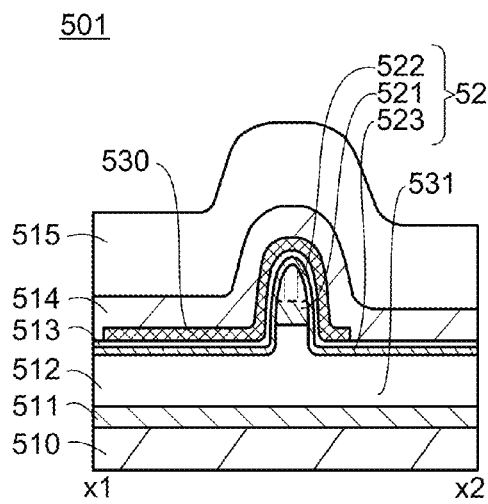
Figure 15D:
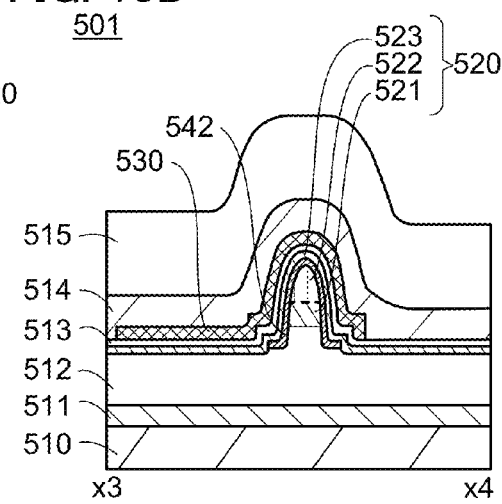

FIGS. 15A to 15D illustrate a structure example of an OS transistor. FIG. 15A is a top view illustrating the structure example of the OS transistor. FIG. 15B is a cross-sectional view taken along line y1-y2, FIG. 15C is a cross-sectional view taken along line x1-x2, and FIG. 15D is a cross-sectional view taken along line x3-x4. Here, in some cases, the direction of the line y1-y2 is referred to as a channel length direction, and the direction of the line x1-x2 is referred to as a channel width direction. Accordingly, FIG. 15B illustrates a cross-sectional structure of the OS transistor in the channel length direction, and FIGS. 15C and 15D each illustrate a cross-sectional structure of the OS transistor in the channel width direction. Note that to clarify the device structure, FIG. 15A does not illustrate some components.

An OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor (OS) layers 521 to 523, a conductive layer 530, a conductive layer 541, and a conductive layer 542. The insulating layer 513 includes a region functioning as a gate insulating layer. The conductive layer 530 functions as a gate electrode. Here, the OS layers 521, 522, and 523 are collectively referred to as an OS layer 520.

As illustrated in FIGS. 15B and 15C, the OS layer 520 includes a region where the OS layer 521, the OS layer 522, and the OS layer 523 are stacked in this order. The insulating layer 513 covers this stacked region. The conductive layer 530 overlaps the stacked region with the insulating layer 513 positioned therebetween. The conductive layer 541 and the conductive layer 542 are provided over the stacked film formed of the OS layer 521 and the OS layer 523 and are in contact with a top surface of this stacked film and a side surface positioned in the channel length direction of the stacked film. In the example of FIGS. 15A to 15D, the conductive layers 541 and 542 are also in contact with the insulating layer 512. The OS layer 523 is formed to cover the OS layers 521 and 522 and the conductive layers 541 and 542. A bottom surface of the OS layer 523 is in contact with a top surface of the OS layer 522.

The conductive layer 530 is formed so as to surround, in the channel width direction, the region where the OS layers 521 to 523 are stacked in the OS layer 520 with the insulating layer 513 positioned therebetween (see FIG. 15C). Therefore, a gate electric field in the vertical direction and a gate electric field in the lateral direction are applied to this stacked region. In the OS transistor 501, the "gate electric field" refers to an electric field generated by voltage applied to the conductive layer 530 (gate electrode layer). Accordingly, the whole stacked region of the OS layers 521 to 523 can be electrically surrounded by the gate electric fields, so that a channel is formed in the whole OS layer 522 (bulk), in some cases. Thus, high on-state current of the OS transistor 501 can be achieved.

In this specification, a structure of a transistor in which a semiconductor is electrically surrounded by a gate electric field as in the above transistor is referred to as a surrounded channel (s-channel) structure. The OS transistor 501 has the s-channel structure. With this s-channel structure, a large amount of current can flow between the source and the drain of the transistor, so that a high drain current in an on state (on-state current) can be achieved.

By employing the s-channel structure in the OS transistor 501, channel formation region controllability by a gate electric field applied to the side surface of the OS layer 522 becomes easy. In the structure where the conductive layer 530 reaches below the OS layer 522 and faces the side surface of the OS layer 521, higher controllability can be achieved, which is preferable. Consequently, the subthreshold swing (S value) of the OS transistor 501 can be made small, so that a short-channel effect can be reduced. Therefore, this is suitable for miniaturization.

When an OS transistor has a three-dimensional structure as in the OS transistor 501 illustrated in FIGS. 15A to 15D, the channel length can be less than 100 nm. By miniaturization of the OS transistor, circuit area can be made small. The channel length of the OS transistor is preferably less than 65 nm, further preferably less than or equal to 30 nm or less than or equal to 20 nm. The channel length is at least 10 nm.

A conductor functioning as a gate of a transistor is referred to as a gate electrode. A conductor functioning as a source of a transistor is referred to as a source electrode. A conductor functioning as a drain of a transistor is referred to as a drain electrode. A region functioning as a source of a transistor is referred to as a source region. A region functioning as a drain of a transistor is referred to as a drain region. In this specification, a gate electrode is referred to as a gate, a drain electrode or a drain region is referred to as a drain, and a source electrode or a source region is referred to as a source in some cases.

The channel length refers to, for example, a distance between a source and a drain in a region where a semiconductor (or a portion where a current flows in a semiconductor when a transistor is on) and a gate overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the OS layer 520. For this reason, the insulating layer 512 is preferably an insulating film containing oxygen, more preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) so as to have a flat surface.

The insulating layers 511 and 512 can be formed using an insulating material of aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, silicon nitride oxide, aluminum nitride oxide, or the like, or a mixed material of these materials. In this specification, oxynitride refers to a material which includes more oxygen than nitrogen, and nitride oxide refers to a substance which includes more nitrogen than oxygen.

<Gate Electrode>

The conductive layer 530 is preferably formed using a metal selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy containing any of these metals as its main component; or a compound containing any of these metals as its main component.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

<Gate Insulating Layer>

The insulating layer 513 is formed using an insulating film having a single-layer structure or a layered structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably contains hafnium oxide, and silicon oxide or silicon oxynitride.

Hafnium oxide has a higher dielectric constant than silicon oxide and silicon oxynitride. Therefore, the insulating layer 513 using hafnium oxide can have a larger thickness than the insulating layer 513 using silicon oxide, so that leakage current due to tunnel current can be reduced. That is, a transistor with low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with low off-state current. Examples of the crystal structure include a monoclinic crystal structure and a cubic crystal structure. Note that one embodiment of the present invention is not limited to the above examples.

<Source Electrode, Drain Electrode, Back Gate Electrode>

The conductive layers 541 and 542 can be formed in a manner similar to that of the conductive layer 530. A Cu—Mn alloy film is preferably used for the conductive layers 541 and 542 because of its low electrical resistance, because it forms manganese oxide at the interface with an oxide semiconductor film when formed in contact with the oxide semiconductor film, and because manganese oxide can prevent Cu diffusion. Furthermore, a conductive layer 531 described later (see FIG. 17A to 17C) can be formed in a manner similar to that of the conductive layer 530.

<Protective Insulating Film>

The insulating layer 514 preferably has a function of blocking oxygen, hydrogen, water, an alkali metal, an alkaline earth metal, and the like. The insulating layer 514 can prevent outward diffusion of oxygen from the OS layer 520 and entry of hydrogen, water, or the like into the OS layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be used.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the OS layer 520, preventing release of oxygen, which is the main component of the OS layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a stacked-layer structure. The insulating layer can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Oxide Semiconductor Layer>

As the semiconductor material of the OS layers 521 to 523, typically, an In—Ga oxide, an In—Zn oxide, or an In—M—Zn oxide (M is Ga, Y, Sn, Zr, La, Ce, Nd, or the like) is used. The element M is an element having a high bonding energy with oxygen, for example. Alternatively, the element M is an element whose bonding energy with oxygen is higher than that of indium. The OS layers 521 to 523 are not limited to the oxide layers containing indium. The OS layers 521 to 523 can be formed using a Zn—Sn oxide layer, a Ga—Sn oxide layer, or a Zn—Mg oxide layer, for example. The OS layer 522 is preferably formed using an In—M—Zn oxide. The OS layers 521 and 523 can be formed using a Ga oxide.

The OS layer 522 is not limited to the oxide semiconductor containing indium. The OS layer 522 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the OS layer 522, an oxide with a wide energy gap may be used. The energy gap of the OS layer 522 is, for example, 2.5 eV or larger and 4.2 eV or smaller, preferably 2.8 eV or larger and 3.8 eV or smaller, more preferably 3 eV or larger and 3.5 eV or smaller.

The OS layer 522 is preferably a CAAC-OS film which will be described later. When the oxide semiconductor contains Zn, the oxide semiconductor is easily to be crystallized, for example. Thus, the OS layer 522 preferably contains Zn.

When an interface level is formed at the interface between the OS layer 522 and the OS layer 521, a channel region is formed also in the vicinity of the interface, which causes a change in the threshold voltage of the OS transistor 501. It is preferable that the OS layer 521 contains at least one of the metal elements contained in the OS layer 522. Accordingly, an interface level is unlikely to be formed at the interface between the OS layer 522 and the OS layer 523, and variations in the electrical characteristics of the OS transistor 501, such as the threshold voltage can be reduced.

The OS layer 523 preferably contains at least one of the metal elements contained in the OS layer 522 because interface scattering is unlikely to occur at the interface between the OS layer 522 and the OS layer 523, and carrier transfer is not inhibited. Thus, the field-effect mobility of the OS transistor 501 can be increased.

The OS layers 521, 522, and 523 preferably include at least Indium. In the case of using an In—M—Zn oxide as the OS layer 521, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In—M—Zn oxide as the OS layer 522, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In—M—Zn oxide as the OS layer 523, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the OS layer 523 may be an oxide that is the same type as that of the OS layer 521. Note that the OS layer 521 and/or the OS layer 523 do/does not necessarily contain indium in some cases. For example, the OS layer 521 and/or the OS layer 523 can be formed using a gallium oxide film.

It is preferable that the OS layer 522 have the highest carrier mobility among the OS layers 521 to 523. Accordingly, a channel can be formed in the OS layer 522 that is apart from the insulating layer 511.

In an oxide containing In such as an In—M—Zn oxide, carrier mobility can be increase by an increase in the In content. In the In—M—Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, whereby carrier mobility can be increased.

When an oxide semiconductor film is deposited by a sputtering method, because of heating of a substrate surface (the surface on which the CAAC-OS is deposited), space heating, or the like, the composition of the film is sometimes different from that of a target as a source or the like. For example, in the case of using a target of an In—Ga—Zn oxide, since zinc oxide sublimates more easily than indium oxide, gallium oxide, or the like, the source and the In—Ga—Zn oxide are likely to have different compositions. Specifically, the content of Zn is smaller than that of the source in the In—Ga—Zn oxide. Thus, the source is preferably selected taking into account the change in composition. Note that a difference between the compositions of the source and the film is also affected by a pressure or a gas used for the deposition as well as a temperature.

In the case where the OS layer 522 is an In—M—Zn oxide formed by a sputtering method, it is preferable that the atomic ratio of metal elements of a target used for depositing the In—M—Zn oxide be In:M:Zn=1:1:1, 3:1:2, or 4:2:4.1. For example, the atomic ratio of metal elements contained in a semiconductor film deposited using a target of In:M:Zn=4:2:4.1 is approximately In:M:Zn=4:2:3.

In the case where each of the OS layers 521 and 523 is an In—M—Zn oxide formed by a sputtering method, it is preferable that the atomic ratio of metal elements of a target used for depositing the In—M—Zn oxide be In:M:Zn=1:3:2 or 1:3:4.

In the case where the oxide semiconductor film is formed by a sputtering method, a power supply device for generating plasma can be an RF power supply device, an AC power supply device, a DC power supply device, or the like as appropriate. As a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. Furthermore, a target may be appropriately selected in accordance with the composition of the oxide semiconductor to be formed.

To make the oxide semiconductor intrinsic or substantially intrinsic, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor can be prevented as much as possible.

<Energy Band Structure>

Figure 16A:
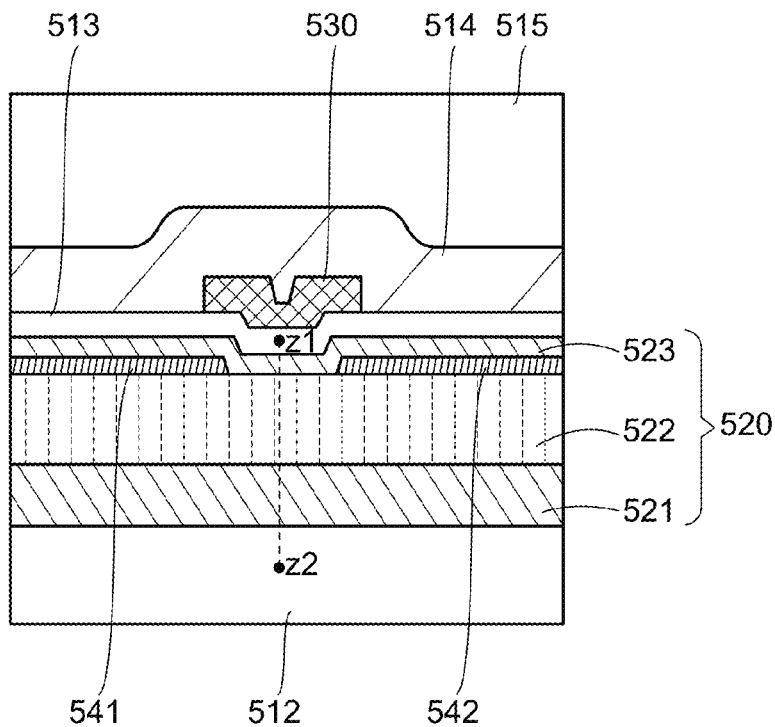
FIG. 16A is a partly enlarged view of FIG. 15B.
Figure 16B:
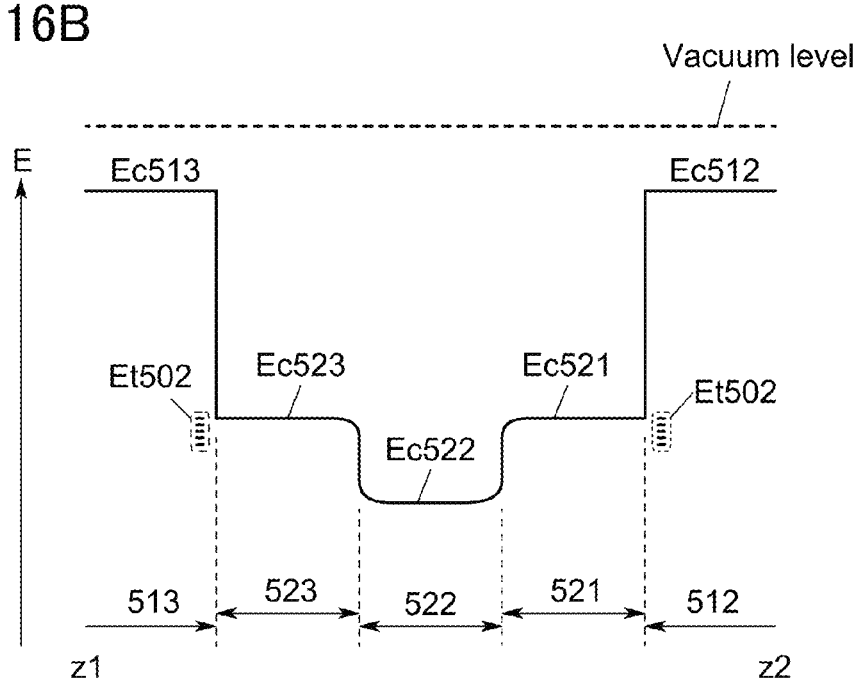
FIG. 16B is an energy band diagram of an OS transistor.

Next, the function and effect of the OS layer 520 in which the OS layers 521, 522, and 523 are stacked are described using an energy band diagram in FIG. 16B. FIG. 16A is an enlarged view of a channel region of the OS transistor 501 in FIG. 15B. FIG. 16B shows an energy band diagram of a portion taken along dotted line z1-z2 (the channel formation region of the OS transistor 501) in FIG. 16A. The OS transistor 501 is described below as an example, but the same applies to the OS transistors 502 to 506.

In FIG. 16B, Ec512, Ec521, Ec522, Ec523, and Ec513 indicate the energy at the bottom of the conduction band of the insulating layer 512, the OS layer 521, the OS layer 522, the OS layer 523, and the insulating layer 513, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the OS layers 521, 522, and 523).

The OS layer 522 is an oxide layer which has a larger electron affinity than the OS layers 521 and 523. For example, as the OS layer 522, an oxide having higher electron affinity than those of the OS layer 521 and the OS layer 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

When voltage is applied to the gate (the conductive layer 530) of the OS transistor 501, a channel is formed in the OS layer 522 having the highest electron affinity among the OS layers 521, 522, and 523.

An indium gallium oxide has small electron affinity and a high oxygen-blocking property. Therefore, the OS layer 523 preferably contains an indium gallium oxide. The gallium atomic ratio [Ga/(In+Ga)] is, for example, higher than or equal to 70%, preferably higher than or equal to 80%, more preferably higher than or equal to 90%.

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

In some cases, there is a mixed region of the OS layer 521 and the OS layer 522 between the OS layer 521 and OS layer 522. Furthermore, in some cases, there is a mixed region of the OS layer 523 and the OS layer 522 between the OS layer 523 and OS layer 522. Because the mixed region has a low interface state density, a stack of the OS layers 521 to 523 (the OS layer 520) has a band structure where energy at each interface and in the vicinity of the interface is changed continuously (continuous junction).

Electrons transfer mainly through the OS layer 522 in the OS layer 520 having such an energy band structure. Therefore, even if an interface state exists at the interface between the OS layer 521 and the insulating layer 512 or the interface between the OS layer 523 and the insulating layer 513, electron movement in the OS layer 520 is less likely to be inhibited and the on-sate current of the OS transistor 501 can be increased.

Although trap states Et502 due to impurities or defects might be formed in the vicinity of the interface between the OS layer 521 and the insulating layer 512 and the interface between the OS layer 523 and the insulating layer 513 as illustrated in FIG. 16B, the OS layer 522 can be separated from the trap states Et502 owing to the existence of the OS layers 521 and 523. In the transistor 501, in the channel width direction, the top surface and side surfaces of the OS layer 522 are in contact with the OS layer 523, and the bottom surface of the OS layer 522 is in contact with the OS layer 521 (see FIG. 15C). Surrounding the OS layer 522 by the OS layers 521 and 523 in this manner can further reduce the influence of the trap states Et502.

However, when the energy difference between Ec522 and Ec521 or Ec523 is small, an electron in the OS layer 522 might reach the trap state by passing over the energy difference. Since the electron is trapped in the trap level, negative fixed electric charge is caused at the interface with the insulating film; thus, the threshold voltage of the transistor is shifted in a positive direction. Therefore, each of the energy gaps between Ec521 and Ec522 and between Ec522 and Ec523 is preferably 0.1 eV or more, or further preferably 0.15 eV or more, in which case a change in the threshold voltage of the OS transistor 501 can be reduced and the OS transistor 501 can have favorable electrical characteristics.

As factors of inhibiting electron movement are decreased, the on-state current of the transistor can be increased. For example, in the case where there is no factor of inhibiting electron movement, electrons are assumed to be moved efficiently. Electron movement is inhibited, for example, in the case where physical unevenness in the channel formation region is large. The electron movement is also inhibited, for example, in the case where the density of defect states is high in a region where a channel is formed.

To increase the on-state current of the OS transistor 501, for example, root mean square (RMS) roughness with a measurement area of 1 μm×1 μm of a top surface or a bottom surface of the OS layer 522 (a formation surface; here, the OS layer 521) is less than 1 nm, preferably less than 0.6 nm, further preferably less than 0.5 nm, still further preferably less than 0.4 nm. The average surface roughness (also referred to as Ra) with the measurement area of 1 μm×1 μM is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm.

For example, in the case where the OS layer 522 contains oxygen vacancies (also denoted by $V_o$), donor levels are formed by entry of hydrogen into sites of oxygen vacancies in some cases. A state in which hydrogen enters sites of oxygen vacancies is denoted by $V_oH$ in the following description in some cases. $V_oH$ is a factor of decreasing the on-state current of the transistor because $V_oH$ scatters electrons. Note that sites of oxygen vacancies become more stable by entry of oxygen than by entry of hydrogen. Thus, by decreasing oxygen vacancies in the OS layer 522, the on-state current of the transistor can be increased in some cases. For example, the hydrogen concentration at a certain depth in the OS layer 522 or in a certain region of the OS layer 522, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

To decrease oxygen vacancies in the OS layer 522, for example, there is a method in which excess oxygen in the insulating layer 512 is moved to the OS layer 522 through the OS layer 521. In this case, the OS layer 521 is preferably a layer having an oxygen-transmitting property (a layer through which oxygen passes or is transmitted).

In the case where the OS transistor 501 has an s-channel structure, a channel can be formed in the whole OS layer 522. The thickness of the OS layer 522 may be greater than or equal to 10 nm and less than or equal to 100 nm, or greater than or equal to 10 nm and less than or equal to 30 nm.

Moreover, the thickness of the OS layer 523 is preferably small to increase the on-state current of the transistor. The thickness of the OS layer 523 is less than 10 nm, preferably less than or equal to 5 nm, or further preferably less than or equal to 3 nm, for example. Meanwhile, the OS layer 523 has a function of blocking entry of elements other than oxygen (such as hydrogen and silicon) included in the adjacent insulator into the OS layer 522. For example, the OS layer 523 has a region with a thickness of greater than or equal to 0.3 nm, preferably greater than or equal to 1 nm, more preferably greater than or equal to 2 nm. The OS layer 523 preferably has an oxygen blocking property to suppress outward diffusion of oxygen released from an insulating film 512 and the like.

To improve reliability, preferably, the thickness of the OS layer 521 is large and the thickness of the OS layer 523 is small. For example, the OS layer 521 has a region with a thickness of, for example, greater than or equal to 10 nm, preferably greater than or equal to 20 nm, further preferably greater than or equal to 40 nm, still further preferably greater than or equal to 60 nm. When the thickness of the OS layer 521 is made large, a distance from an interface between the adjacent insulator and the OS layer 521 to the OS layer 522 in which a channel is formed can be large. Since the productivity of the semiconductor device might be decreased, the OS layer 521 has a region with a thickness of, for example, less than or equal to 200 nm, preferably less than or equal to 120 nm, further preferably less than or equal to 80 nm.

In order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to a state where an oxide semiconductor has a carrier density lower than $1\times10^{17}/cm^3$, preferably lower than $1\times10^{15}/cm^3$, more preferably lower than $1\times10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity levels serve as traps and might cause the electric characteristics of the transistor to deteriorate. Therefore, it is preferable to reduce the concentration of the impurities in the OS layers 521, 522, and 523 and at interfaces between the OS layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1\times10^{19}$ atoms/cm$^3$, preferably lower than $5\times10^{18}$ atoms/cm$^3$, further preferably lower than $1\times10^{18}$ atoms/cm$^3$. The concentration of hydrogen at a certain depth of the oxide semiconductor or in a region of the oxide semiconductor is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen at a certain depth of the oxide semiconductor or in a region of the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, in the case where the oxide semiconductor includes a crystal, high concentration of silicon or carbon might reduce the crystallinity of the oxide semiconductor. In order not to reduce the crystallinity of the oxide semiconductor, for example, the concentration of silicon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$. Furthermore, the concentration of carbon at a certain depth of the oxide semiconductor or in a region of the oxide semiconductor is lower than $1\times10^{19}$ atoms/cm$^3$, preferably lower than $5\times10^{18}$ atoms/cm$^3$, further preferably lower than $1\times10^{18}$ atoms/cm$^3$, for example.

A transistor in which the above highly purified oxide semiconductor is used for a channel formation region exhibits extremely low off-state current. When voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 15A to 15D show examples in which the OS layer 520 has a three-layer structure; however, the present invention is not limited thereto. For example, the OS layer 520 may have a two-layer structure without the OS layer 521 or the OS layer 523. Alternatively, the OS layer 520 may have a four-layer structure in which any one of the oxide semiconductors described as the OS layers 521, 522 and 523 is provided below or over the OS layer 521 or below or over the OS layer 523. Alternatively, the OS layer 520 may have an n-layer structure (n is an integer of 5 or more) in which any one of the oxide semiconductors (e.g., the OS layers 521 to 523) is provided at two or more of the following positions: between arbitrary layers in the OS layer 520, over the OS layer 520, and below the OS layer 520.

<<Structure Example 2 of OS Transistor>>

Figure 17A:
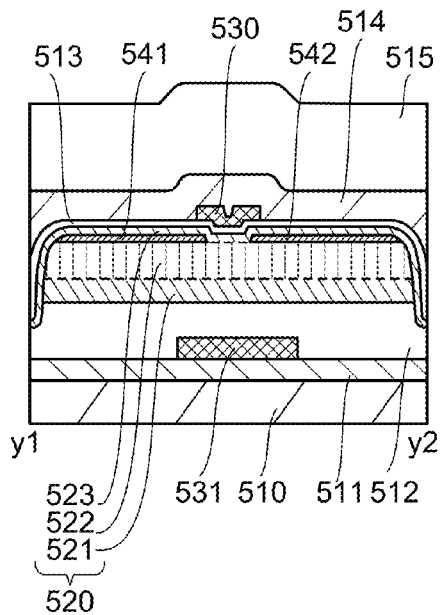
FIGS. 17A to 17C are cross-sectional views each illustrating a structure example of an OS transistor.

The OS transistor 502 in FIG. 17A is a modification example of the OS transistor 501. Like the OS transistor 501, the OS transistor 502 illustrated also has an s-channel structure. The OS transistor 502 is different from the OS transistor 501 in the shapes of the conductive layers 541 and 542 and in that the conductive layer 531 is provided over the insulating layer 511.

The conductive layer 531 functions as a back gate electrode. A constant potential, the same potential or signal supplied to the conductive layer 530, or a potential or signal that is different from that supplied to the conductive layer 530 may be supplied to the conductive layer 531. The conductive layer 541 and the conductive layer 542 function as a source electrode and a drain electrode.

The conductive layer 541 and the conductive layer 542 in the OS transistor 502 are formed from a hard mask used for forming the stacked film of the OS layer 521 and the OS layer 522. Therefore, the conductive layer 541 and the conductive layer 542 do not have regions in contact with the side surfaces of the OS layer 521 and the OS layer 522.

For example, through the following steps, the OS layers 521 and 522 and the conductive layers 541 and 542 can be formed. A two-layer oxide semiconductor film including the OS layers 521 and 522 is formed. A single-layer or multilayer conductive film is formed over the oxide semiconductor film. This conductive film is etched, so that a hard mask is formed. Using this hard mask, the two-layer oxide semiconductor film is etched to form the OS layers 521 and 522. Then, the hard mask is etched to form the conductive layer 541 and the conductive layer 542.

The conductive layer 531 can function as a back gate electrode of the OS transistor 502. The conductive layer 531 can be provided in the OS transistor 501 in FIGS. 15A to 15D, and OS transistors 503 to 506 (FIGS. 17B and 17C and FIGS. 18A and 18B) which will be described later.

<Structure Examples 3 and 4 of OS Transistor>

Figure 17B:
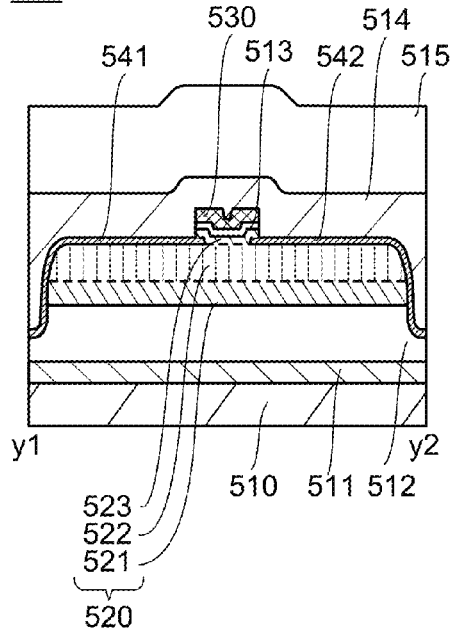
Figure 17C:
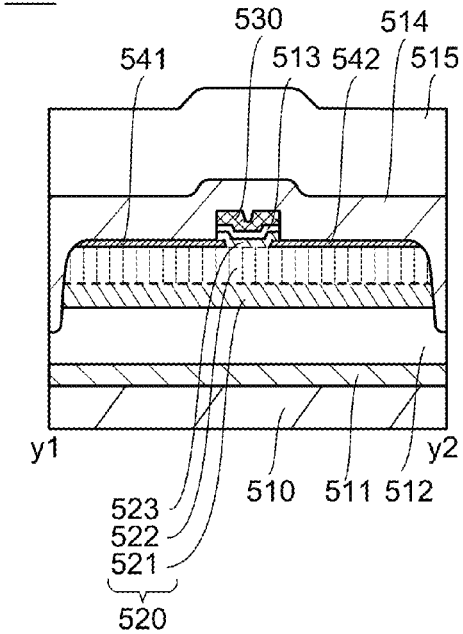

An OS transistor 503 illustrated in FIG. 17B is a modification example of the OS transistor 501, and an OS transistor 504 illustrated in FIG. 17C is a modification example of the OS transistor 502. In each of the OS transistors 503 and 504, the OS layer 523 and the insulating layer 513 are etched using the conductive layer 530 as a mask. Thus, an edge of the OS layer 523 and an edge of the insulating layer 513 are substantially aligned with an edge of the conductive layer 530.

<Structure Examples 5 and 6 of OS Transistor>

Figure 18A:
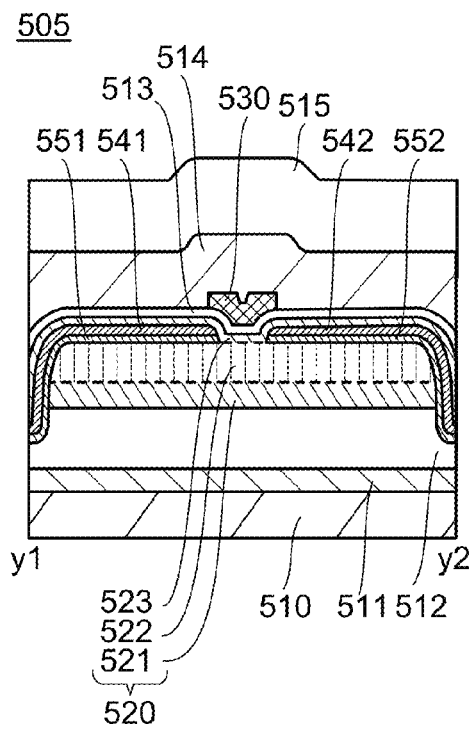
FIGS. 18A and 18B are cross-sectional views each illustrating a structure example of an OS transistor.
Figure 18B:
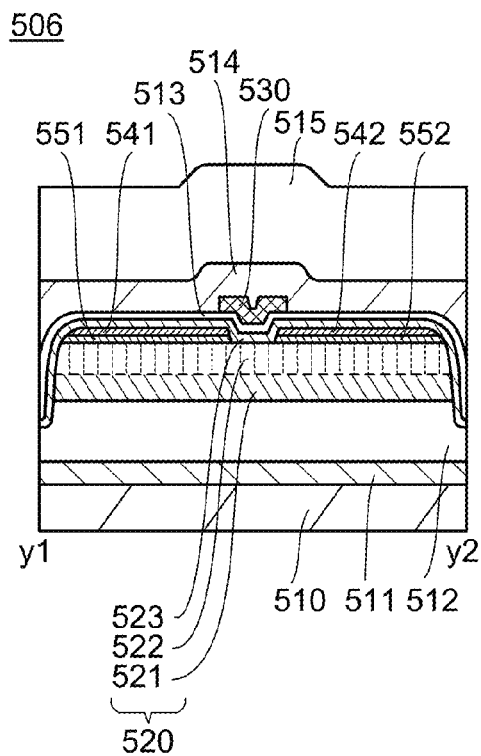

An OS transistor 505 illustrated in FIG. 18A is a modification example of the OS transistor 501, and an OS transistor 506 illustrated in FIG. 18B is a modification example of the OS transistor 502. The OS transistor 505 has a layer 551 between the OS layer 523 and the conductive layer 541. The OS transistor 506 has a layer 552 between the OS layer 523 and the conductive layer 542.

The layers 551 and 552 can each be formed using a layer of a transparent conductor, an oxide semiconductor, a nitride semiconductor, or an oxynitride semiconductor, for example. The layers 551 and 552 can be formed using an n-type oxide semiconductor layer or can be formed using a conductive layer that has higher resistance than the conductive layers 541 and 542. The layers 551 and 552 may be formed using, for example, any of a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, and the like. Any of these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

The layers 551 and 552 are preferably formed using a layer that does not form a Schottky barrier with the OS layer 523. Thus, on-state characteristics of the OS transistors 505 and 506 can be improved.

Note that the layers 551 and 552 preferably have higher resistance than the conductive layers 541 and 542. The layers 551 and 552 each preferably have resistance lower than the channel resistances of the OS transistors 505 and 506. For example, the layers 551 and 552 may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with small channel length can have favorable saturation characteristics. Note that in a circuit configuration where the sources and the drains of the OS transistors 505 and 506 do not interchange during the operation, only one of the layers 551 and 552 (e.g., the layer on the drain side) may be preferably provided.

<<Structure of Oxide Semiconductor>>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. A term "substantially parallel" indicates that the angle formed between two straight lines is greater than or equal to $-30°$ and less than or equal to $30°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$. A term "substantially perpendicular" indicates that the angle formed between two straight lines is greater than or equal to $60°$ and less than or equal to $120°$. In this specification, trigonal and rhombohedral crystal systems are included in a hexagonal crystal system.

<CAAC-OS>

A CAAC-OS is one of oxide semiconductors having a plurality of c-axis aligned crystal parts (also referred to as pellets). Note that a CAAC-OS can be referred to as an oxide semiconductor including c-axis aligned nanocrystals (CANC).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Note that in structural analysis of the CAAC-OS by an out-of-plane method, another peak may appear when $2\theta$ is around $36°$, in addition to the peak at $2\theta$ of around $31°$. The peak of $2\theta$ at around $36°$ indicates that a crystal having no c-axis alignment is included in part of the CAAC-OS. It is preferable that in the CAAC-OS analyzed by an out-of-plane method, a peak appear when $2\theta$ is around $31°$ and that a peak not appear when $2\theta$ is around $36°$.

On the other hand, in structural analysis of the CAAC-OS by an in-plane method in which an X-ray is incident on a sample in a direction substantially perpendicular to the c-axis, a peak appears when $2\theta$ is around $56°$. This peak is derived from the (110) plane of the $InGaZnO_4$ crystal. In the case of the CAAC-OS, when analysis ($\phi$ scan) is performed with $2\theta$ fixed at around $56°$ and with the sample rotated using a normal vector of the sample surface as an axis ($\phi$ axis), a peak is not clearly observed. In contrast, in the case of a single crystal oxide semiconductor of InGaZnO$_4$, when φ scan is performed with 2θ fixed at around 56°, six peaks which are derived from crystal planes equivalent to the (110) plane are observed. Accordingly, the structural analysis using XRD shows that the directions of a-axes and b-axes are irregularly oriented in the CAAC-OS.

The electron diffraction also indicates that pellets included in the CAAC-OS have c-axis alignment and that the c-axes are aligned in a direction substantially perpendicular to the formation surface or the top surface of the CAAC-OS.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. Charges trapped by the carrier traps in the oxide semiconductor take a long time to be released. The trapped charges may behave like fixed electric charges. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). For example, in a high-resolution TEM image of the nc-OS film, a grain boundary is not always found clearly. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor having more regularity than an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

The amorphous oxide semiconductor is such an oxide semiconductor having disordered atomic arrangement and no crystal part. For example, the amorphous oxide semiconductor does not have a specific state as in quartz. In a high-resolution TEM image of the amorphous oxide semiconductor, crystal parts cannot be found. When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called amorphous oxide semiconductors or completely amorphous oxide semiconductors.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed. The a-like OS has an unstable structure because it includes a void. Furthermore, the a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. For example, a semiconductor layer in an OS transistor may be formed of stacked films including two or more of an amorphous oxide semiconductor, an a-like OS, a microcrystalline oxide semiconductor, and a CAAC-OS.

<<Deposition Method>>

A sputtering method and a plasma-enhanced chemical vapor deposition (PECVD) method are typical examples of a method of forming an insulating film, a conductive film, a semiconductor film, and the like. The insulating film, the conductive film, the semiconductor film, and the like may be formed by another method, for example, thermal CVD. Metal organic chemical vapor deposition (MOCVD) or atomic layer deposition (ALD) can be employed as thermal CVD, for example.

A thermal CVD method has an advantage that no defect due to plasma damage is generated since it does not utilize plasma for forming a film. Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film and the semiconductor film that are described in the above embodiment can be formed by thermal CVD such as MOCVD or ALD. For example, in the case where an $InGaZnO_x$ (x>0) film is formed, trimethylindium, trimethylgallium, and dimethylzinc are used. The chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

In the case where an oxide semiconductor film, for example, an $InGaZnO_x$ film (x>0) is formed with a deposition apparatus employing an ALD method, an $In(CH_3)_3$ gas and an $O_3$ gas are sequentially introduced more than once to form an $InO_2$ layer, a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas that is obtained by bubbling with an inert gas such as Ar may be used instead of an $O_3$ gas, it is preferable to use an $O_3$ gas, which does not contain H. Instead of a $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Example 1

A multi-context FPGA of one embodiment of the present invention was fabricated and operational verification thereof was performed. In this example, the verification is described.

As described in Embodiment 1 and the like, an OS transistor has an extremely small off-state current because its active layer is an oxide semiconductor. For example, an off-state current of lower than $1 \times 10^{-21}$ A/μm normalized at 85° C. can be obtained. The use of an OS transistor makes it possible to use a configuration memory (also referred to as a CM in the following description) as what is called a nonvolatile memory which does not need power supply when retaining data.

<<Fabricated FPGA>>

Figure 19:
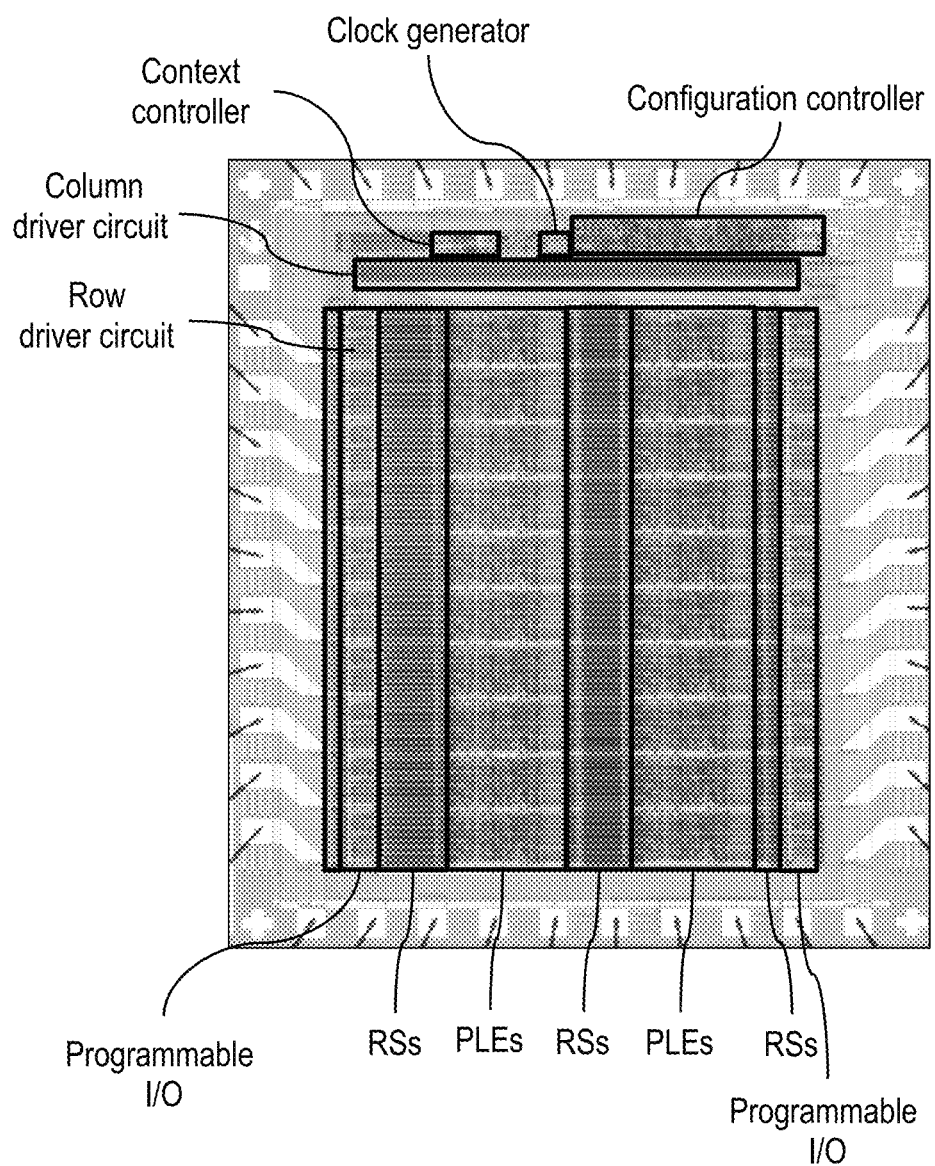
FIG. 19 is a photograph of a chip of a fabricated FPGA.

The fabricated FPGA is a multi-context FPGA with a context number of 2. FIG. 19 shows a photograph of a chip of the fabricated FPGA. The chip is a hybrid device with a combination of OS FETs and a CMOS circuit formed using Si field-effect transistors (FETs). The memory circuit 101 (FIG. 3) is used as the CM of the FPGA, and the switch circuit 121 (FIG. 7) is used as a wiring switch between PLEs (routing switch RS).

The active layer of the OS FET was formed of a CAAC-OS formed using an In—Ga—Zn oxide (IGZO). Hereinafter, the OS FET of the FPGA is referred to as a CAAC-IGZO FET. Like the PLD 200 in FIG. 12A, the chip was fabricated in such a manner that the CAAC-IGZO FET was stacked over the Si FET fabricated through a CMOS process. The technology node of the CMOS process was 0.18 μm, and the technology node of the CAAC-IGZO FET was 0.8 μm. The size of the chip was 24.75 $mm^2$.

<<Design>>

A design methodology for achieving subthreshold driving is proposed for a general application specific integrated circuit (ASIC) or the like (Non-Patent Document 4). To achieve subthreshold driving in an FPGA, there is a need for resolving peculiar problems, which are different from those in an ASIC and the like; and the problems are, for example, a drop of the threshold voltage ($V_t$) in a pass transistor of a switch between PLEs and leakage current due to parallel switches with a low ratio of on-state current ($I_{on}$) to an off-state current ($I_{off}$) (Non-Patent Document 1). The FPGA of this example is designed on the basis of a new design methodology that enables subthreshold driving.

The FPGA used a low transistor stack employed for subthreshold driving of a CMOS ASIC, which is a general PLE, i.e., a CMOS standard cell library fabricated using a NOT gate, a two-input NAND gate, a two-input NOR gate, and a flip-flop circuit using these gates (Non-Patent Document 4). Although a Schmitt trigger logic was proposed for subthreshold driving (Non-Patent Document 4), it is advantageous only for subthreshold voltage driving and might be unsuitable in accordance with an application in which the FPGA can be used.

In the RS of the FPGA, an n-channel Si FET with high $V_t$ (approximately 0.4 V) is used as a pass transistor and an analog memory (AM) including a CAAC-IGZO FET for supplying a high-level potential to the gate of the pass transistor is stacked; therefore, the RS has a low $I_{off}$ and a high $I_{on}$, that is, a high $I_{on}/I_{off}$ ratio. Since the AM of the RS can be regarded as a nonvolatile analog memory, the high-level potential is supplied during a configuration operation and an operation for switching the context of the AM, which can reduce the power consumption in a normal operation and can reduce power for maintaining overdrive voltage of the analog memory built-in pass transistor (APT).

The APT can be used in a pass transistor logic (PTL). Unlike a previously proposed PTL (Non-Patent Document 5), an APT-based PTL (APTL) need not have a CMOS transmission gate or a complementary circuit configuration. Thus, when the APTL is used in a selection circuit for context in the RS, a MUX in the PLE, and the like, the circuit scale of the FPGA can be reduced. Furthermore, subthreshold driving can further reduce the power consumption of the FPGA.

<Device Simulation>

Figure 20A:
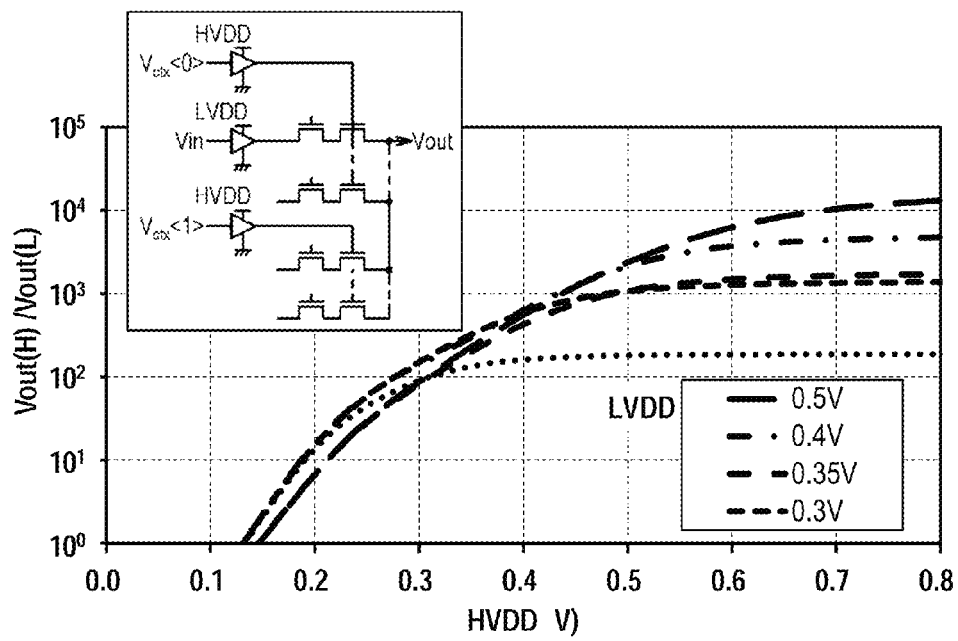
FIGS. 20A and 20B show device simulation results of an RS and a PLE in an FPGA.
Figure 20B:
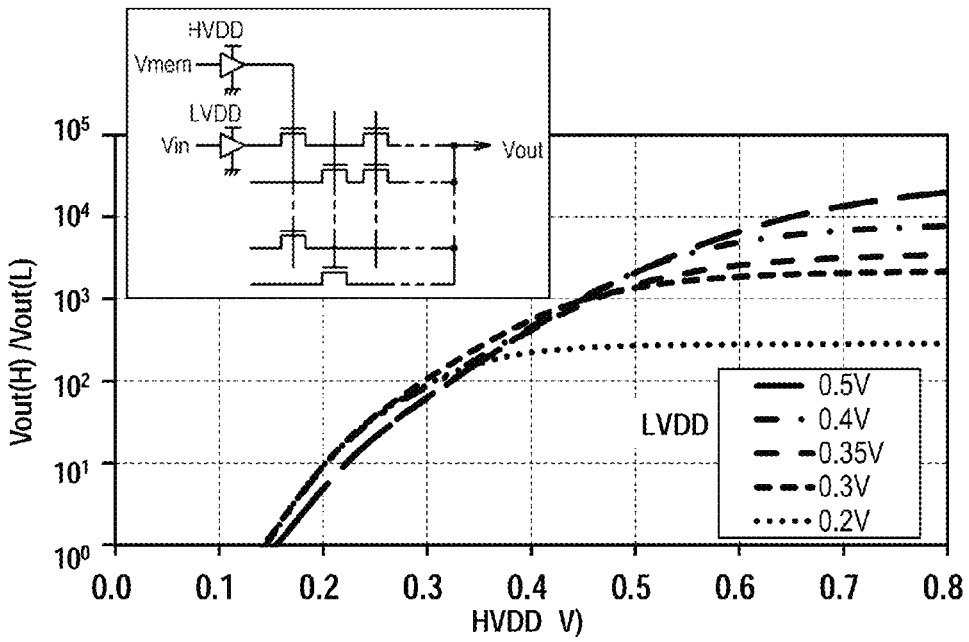

FIGS. 20A and 20B show SPICE simulation results of the RS of the FPGA and the MUX in the PLE. An H/L level ratio of an output voltage to a gate voltage (HVDD) of a pass transistor (Vout (H)/Vout (L)) was estimated under the condition where the variation in characteristics with respect to the H/L level ratio and the bias condition are worst. FIG. 20A shows an H/L level ratio of the pass transistor of the RS, and FIG. 20B shows an H/L level ratio of the pass transistor of the MUX in the PLE.

A circuit shown in FIG. 20A is an equivalent circuit of the RS used in the simulation. The circuit has 64 rows in each of which two n-channel Si FETs are electrically connected in series. The n-channel Si FETs in one row and those in another row are electrically connected in parallel. A circuit shown in FIG. 20B is an equivalent circuit of the MUX used for the simulation. The circuit has 16 rows in each of which six n-channel Si FETs are electrically connected in series. The n-channel Si FETs in one row and those in another row are electrically connected in parallel. HVDD and LVDD denote high-level power supply potentials of the RS and the MUX and HVDD is higher than LVDD. Furthermore, $V_{ctx}<1:0>$ denote the potentials of context signals, and Vmem denotes the potential of a configuration data signal.

Vout (H)/Vout (L) of the RS and the MUX when HVDD was varied from 0 V to 0.8 V and LVDD was set to 0.2 V, 0.3 V, 0.35 V, 0.4 V, and 0.5 V was estimated. According to FIGS. 20A and 20B, as the voltage for driving becomes lower (lower LVDD), the Vout (H)/Vout (L) is improved at a lower HVDD, which indicates that the APTL is suitable for low voltage driving.

<<Configuration and Operational Sequence of FPGA>>

Figure 21:
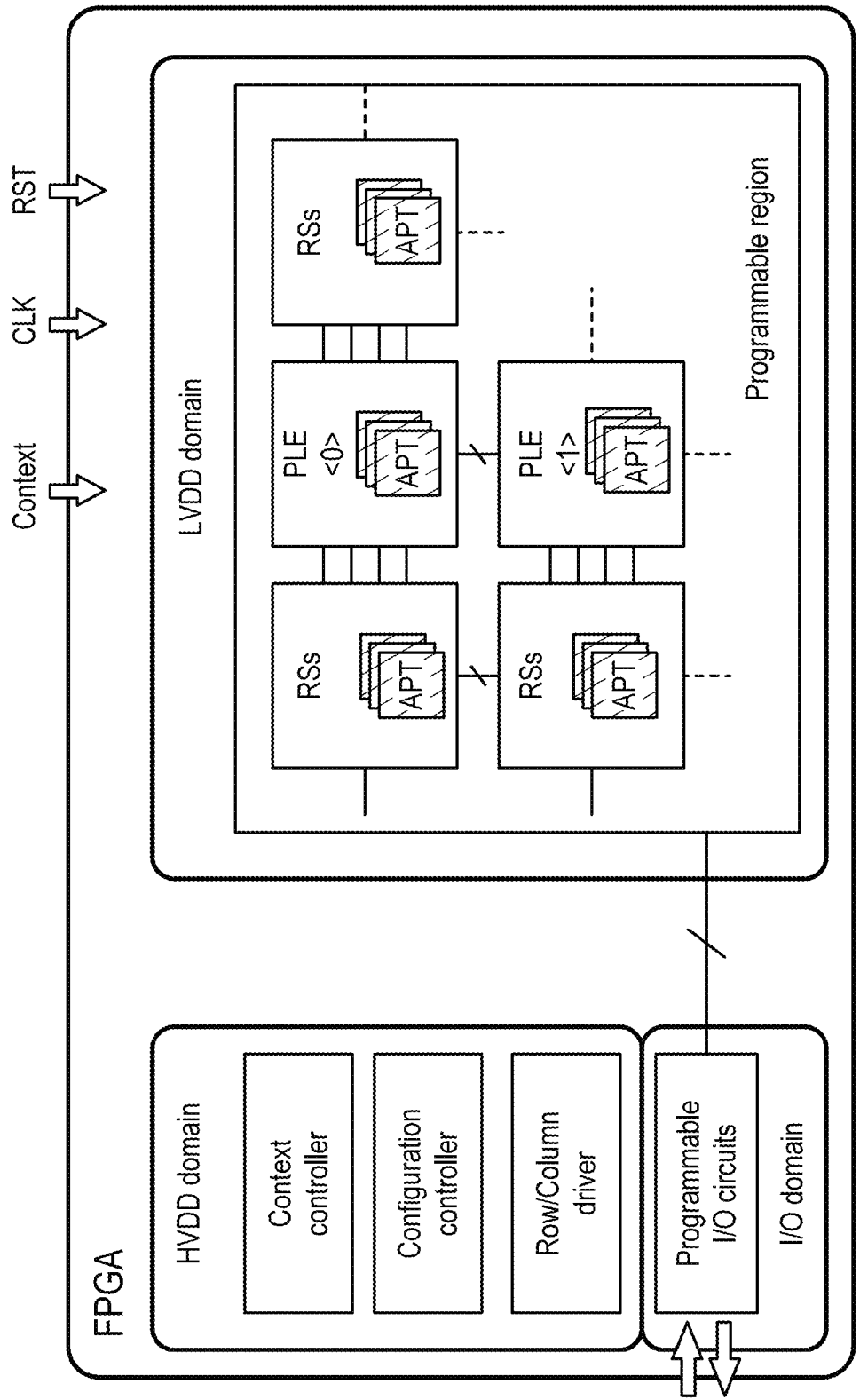
FIG. 21 is a block diagram of a fabricated FPGA.

FIG. 21 is a block diagram of the FPGA. The FPGA includes three power supply domains, an input/output (I/O) domain, a high potential (HVDD) domain, and a lower potential (LDD) domain. The I/O domain includes a programmable I/O circuit. The HVDD domain includes a configuration controller, a context controller, a row driver, and a column driver. The LVDD domain includes a programmable region provided with PLEs and RSs. The PLEs and the RSs each include an APT. Signals Context, CLK, and RST are input to the FPGA from the outside. The signal CLK is a clock signal, and the signal RST is a reset signal. The signal Context is a signal for controlling the timing of switching of context.

FIGS. 22A to 22C show an operational sequence of the FPGA. The FPGA has three modes, i.e., a configuration mode, a normal mode, and a context-switching mode. Signal names such as "*_H" and "*_L" denote signals generated in the HVDD domain and the LVDD domain, respectively.

In the configuration mode, configuration data is written in the CM (i.e., part of the AM) and power is supplied to all the circuits (FIG. 22B). The configuration mode is executed at the start-up of the FPGA. In the normal mode, since a signal from the HVDD domain is not required, power gating of the HVDD domain is performed (FIG. 22A). In the context-switching mode, the context controller is on, context data (selection/non-selection of context) is written to the AM in the APT for a context selection circuit, and data for the MUX is written in the MUX in the PLE. After the context switching, power gating of the context controller is performed. Here, even when the circuits in the HVDD domain are off, the AMs of the CM and the RS retain data, and therefore, the LVDD domain can keep the circuit function without consuming power.

<<RSS>>

Figure 23A:
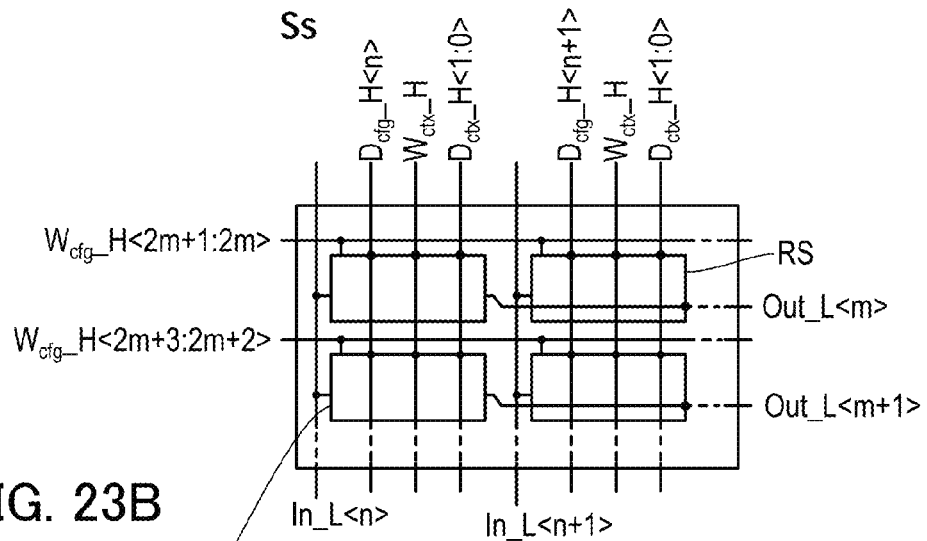
FIG. 23A is a block diagram of RSs of an FPGA.
Figure 23B:
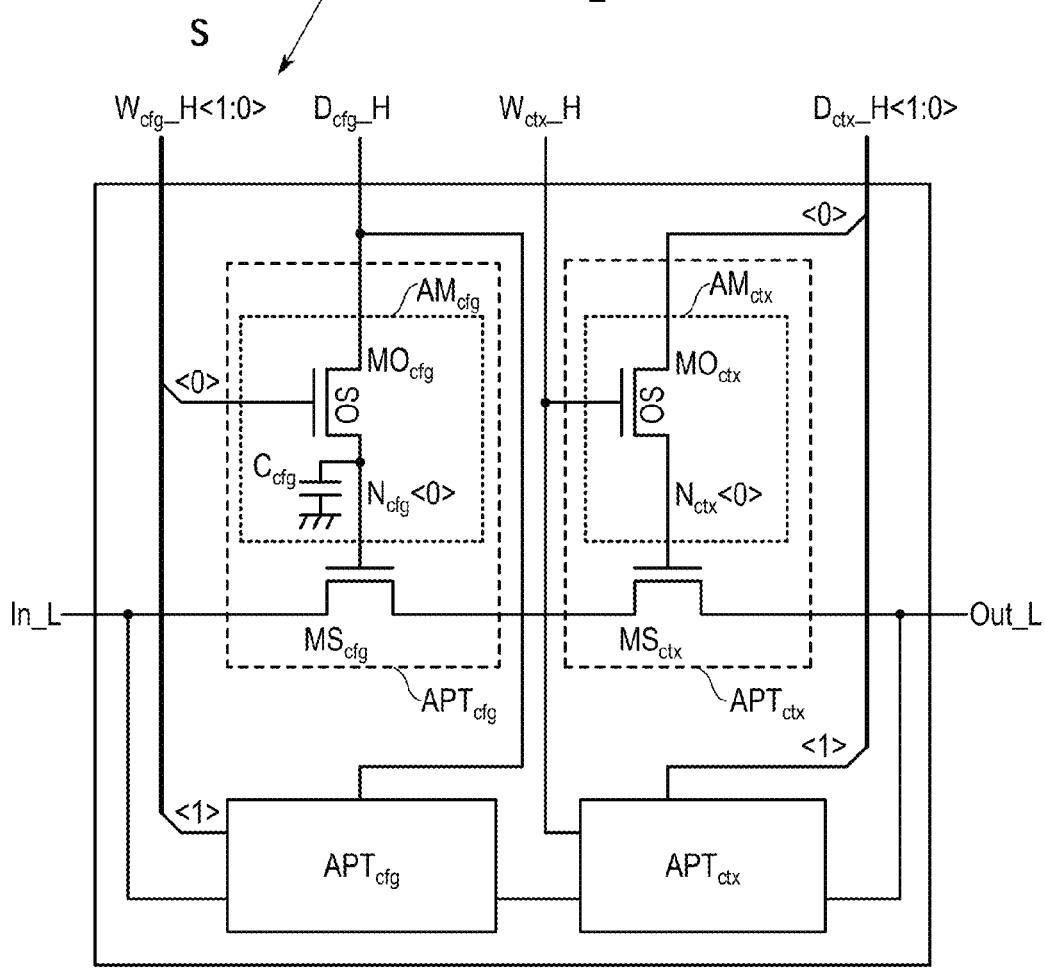
FIG. 23B is a circuit diagram of an RS.
Figure 24:
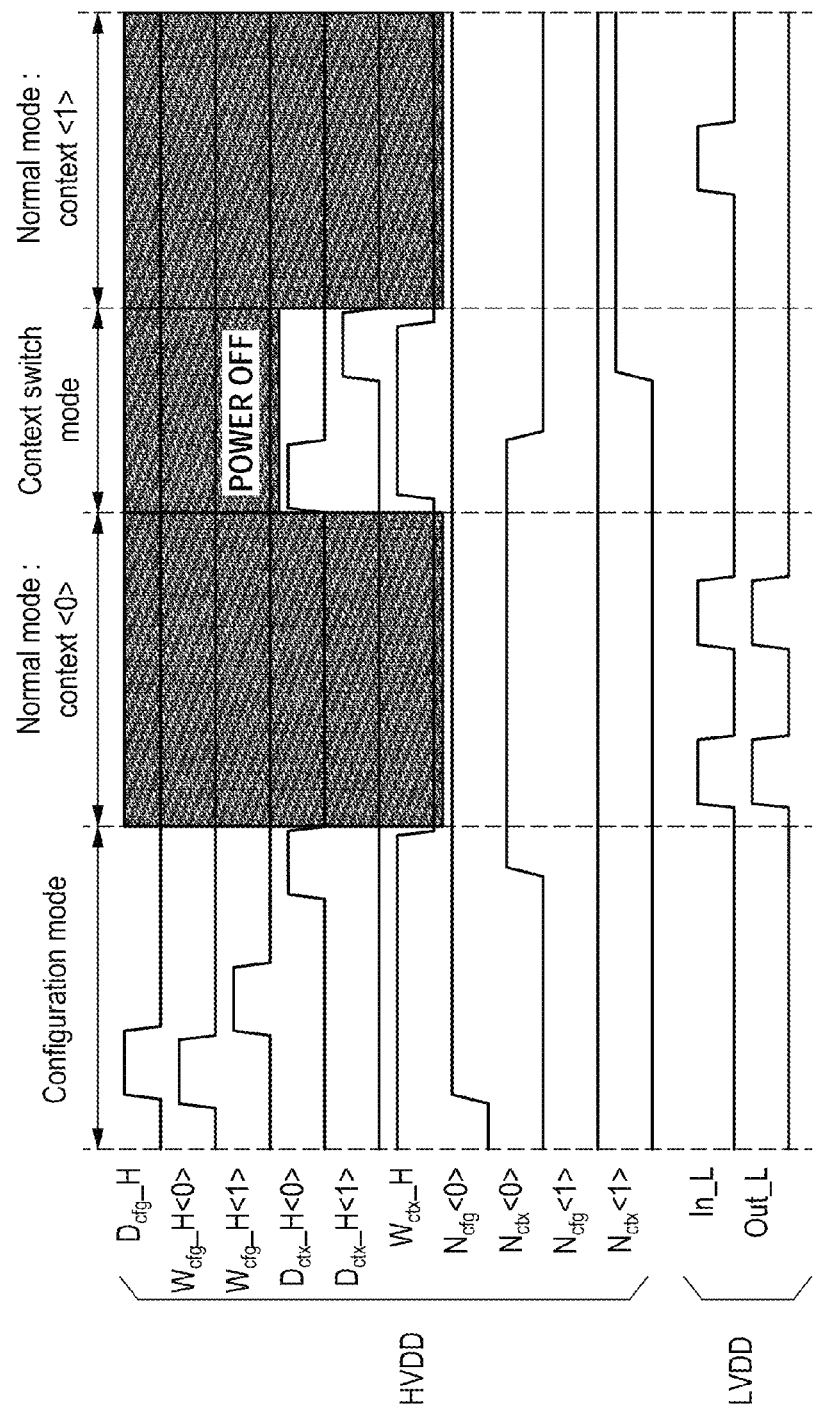
FIG. 24 is a timing chart showing operations of an RS.

FIG. 23A illustrates a block diagram of a switch unit RSs in which a plurality of routing switches RSs are arranged in an array. In FIG. 23A, n and m are each an integer greater than 0. FIG. 23B illustrates a circuit diagram of an RS. FIG. 24 shows an operational timing chart of the RS.

The RS has the same circuit configuration and performs the same operation as the switch circuit 121 in FIG. 7. The RS includes two APTs ($APT_{cfg}$) and two APTs ($APT_{ctx}$). The APTs ($APT_{cfg}$) each include a pass transistor $MS_{cfg}$ and an analog memory $AM_{cfg}$. The analog memory $AM_{cfg}$ includes a transistor $MO_{cfg}$, a node $N_{cfg}$, and a capacitor $C_{cfg}$. The APTs ($APT_{ctx}$) each include a pass transistor $MS_{ctx}$ and an analog memory $AM_{ctx}$. The analog memory $AM_{ctx}$ includes a transistor $MO_{ctx}$, a node $N_{ctx}$, and a capacitor $C_{ctx}$. The pass transistors $MS_{cfg}$ and $MS_{ctx}$ are n-channel Si FETs, and the transistors $MO_{cfg}$ and $MO_{ctx}$ are CAAC-IGZO FETs.

The input node of the RS is electrically connected to the output node of the PLE, and a signal In_L is input to the input node of the RS. The output node of the RS is electrically connected to an input node of another PLE and outputs a signal Out_L. Signals $W_{cfg\_H}$<1:0> and $D_{cfg}$_H are input to the RS from the row driver and the column driver, respectively, and signals $W_{ctx}$_H and $D_{ctx}$_H are input to the RS from the context controller. The signal $D_{cfg}$_H is a configuration data signal. The signal $D_{ctx}$_H is a signal for selecting context, which selects a path of the RS.

In FIG. 24, a high-level potential of the node of the HVDD domain is HVDD, and a low-level potential thereof is GND. In the configuration mode, configuration data is written to the node $N_{cfg}$. The gate voltage of the pass transistor $MS_{cfg}$ ($N_{cfg}$ voltage) is HVDD or GND (ground potential). Furthermore, since Context <0> is selected, a node $N_{ctx}$<0> is set at HVDD, and a node $N_{ctx}$<1> is set at GND. In the context-switching mode, the signals $D_{ctx}$_H<1:0> for selecting Context <1> are respectively written to the analog memories $AM_{ctx}$<1:0>, so that the node $N_{ctx}$<0> is set at GND and the node $N_{ctx}$<1> is set at HVDD.

In a normal mode (Context <0>), a signal transmission path is formed between the input node and the output node of the RS, and thus the potential of the signal Out_L changes in accordance with the potential of the signal In_L. In a normal mode (Context <1>), the signal transmission path between the input node and the output node of the RS is blocked, and thus the signal Out_L is at GND regardless of the signal In_L. In the normal mode, the potentials of the nodes $N_{cfg}$ and $N_{ctx}$ are retained by turning off the transistors $MO_{cfg}$ and $MO_{ctx}$; thus, power gating of the HVDD domain can be performed. Accordingly, a low voltage swing signal can be transmitted with the pass transistors $MS_{cfg}$ and $MS_{ctx}$ with a high $I_{on}/I_{off}$ ratio; therefore, the FPGA is suitable for low voltage driving.

<<PLE>>

Figure 25A:
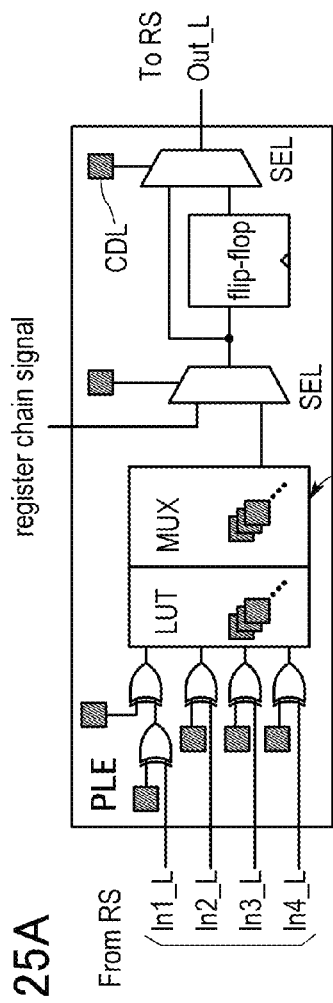
FIG. 25A is a block diagram of a PLE.

FIG. 25A shows a block structure of the PLE. The PLE in FIG. 25A includes a four two-input exclusive ORs (EX-ORs), an LUT, a MUX, two SELs, and a flip-flop. The PLE is provided with a plurality of configuration data logics (CDLs). Data signals generated in the CDLs change the circuit configuration of a sequential circuit such as the LUT.

Figure 25B:
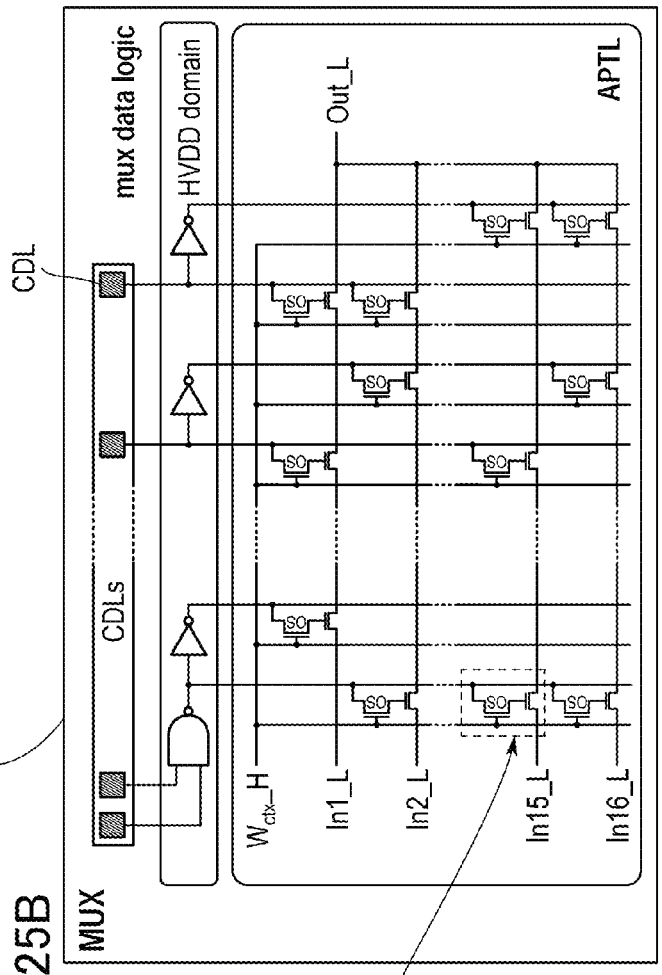
FIG. 25B is a circuit diagram of a MUX.
Figure 25C:
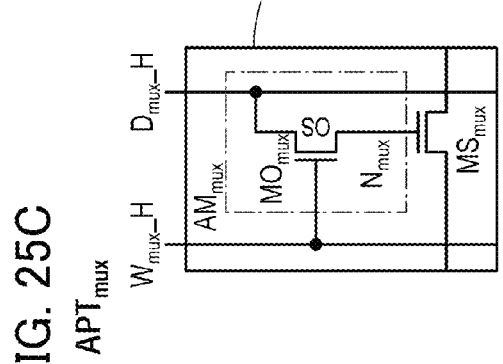
FIG. 25C is a circuit diagram of an APT of the MUX.

FIG. 25B illustrates a circuit diagram of the MUX. The FPGA is provided with an APTL-based MUX. FIG. 25C illustrates a circuit diagram of an APT of the MUX. The MUX includes a plurality of CDLs, a mux data logic, an APTL with the plurality of APTs ($APT_{mux}$) arranged in an array. Each APT ($APT_{mux}$) includes a pass transistor $MS_{mux}$ and an analog memory $AM_{mux}$. The analog memory $AM_{mux}$ includes a transistor MO and a node $N_{mux}$. The pass transistor $MS_{mux}$ is an n-channel Si FET, and the transistor $MO_{mux}$ is a CAAC-IGZO FET. The configuration and operation of the analog memory $AM_{mux}$ are the same as those of the analog memory $AM_{ctx}$ in the RS.

The number of elements in an APTL-based MUX is smaller than that in a CMOS-standard-cell-based MUX, and therefore, the circuit area of the APTL-based MUX can be small. The MUX of the FPGA is a 16-input MUX. Thirty-two CDLs generate data signals to the LUT and the MUX in accordance with configuration data retained in the analog memory $AM_{cfg}$. The mux data logic processes the data signals of the CDLs. To output any one of signals In1_L to In16_L, output data of the CDLs determine on or off of the pass transistor $MS_{mux}$ of each $APT_{mux}$ in the APTL.

In the PLE, the CDL and the mux data logic are circuits of the HVDD domain. The CDL is on in the configuration mode and the context-switching mode, and is subjected to power gating in the normal mode.

<<CDL>>

Figure 26:
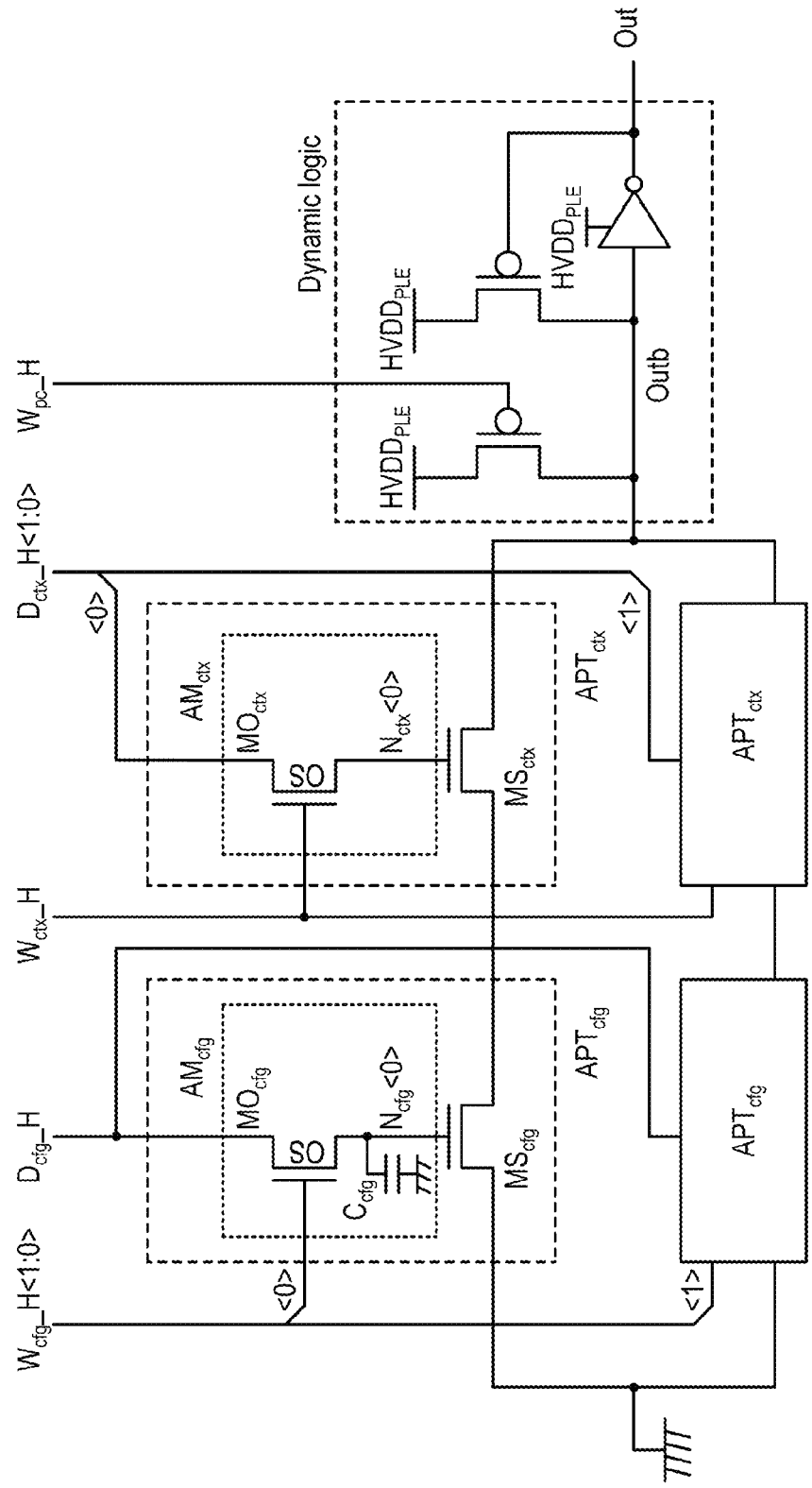
FIG. 26 is a circuit diagram of a CDL.
Figure 27:
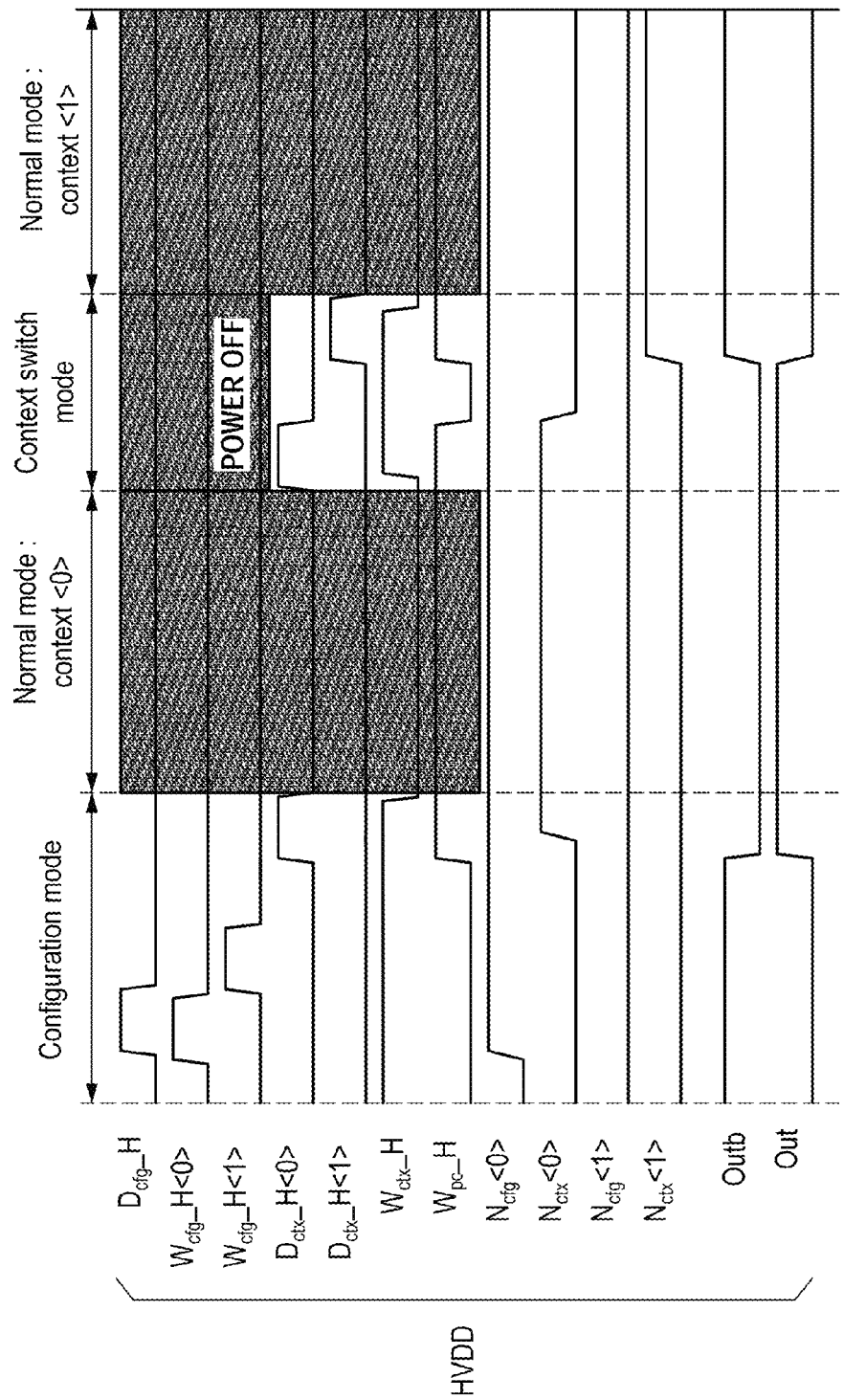
FIG. 27 is a timing chart showing operations of a CDL.

The memory circuit 101 (FIG. 3) is used as the CDL. FIG. 26 illustrates a circuit diagram of the CDL, and FIG. 27 shows a timing chart of the CDL. Although the circuit configuration of the CDL is partly the same as that of the RS, the CDL further includes a dynamic logic circuit. The dynamic logic circuit is formed using Si FETs. The part of the circuit of the CDL similar to that of the RS functions in a manner similar to that of the RS. The CDL outputs $HVDD_{PLE}$ or GND in accordance with configuration data of the analog memory $AM_{cfg}$ and selected context data ($D_{ctx}$_H<0> or $D_{ctx}$_H<1>).

<<Operation Frequency and Power Consumption of FPGA>>

Figure 28:
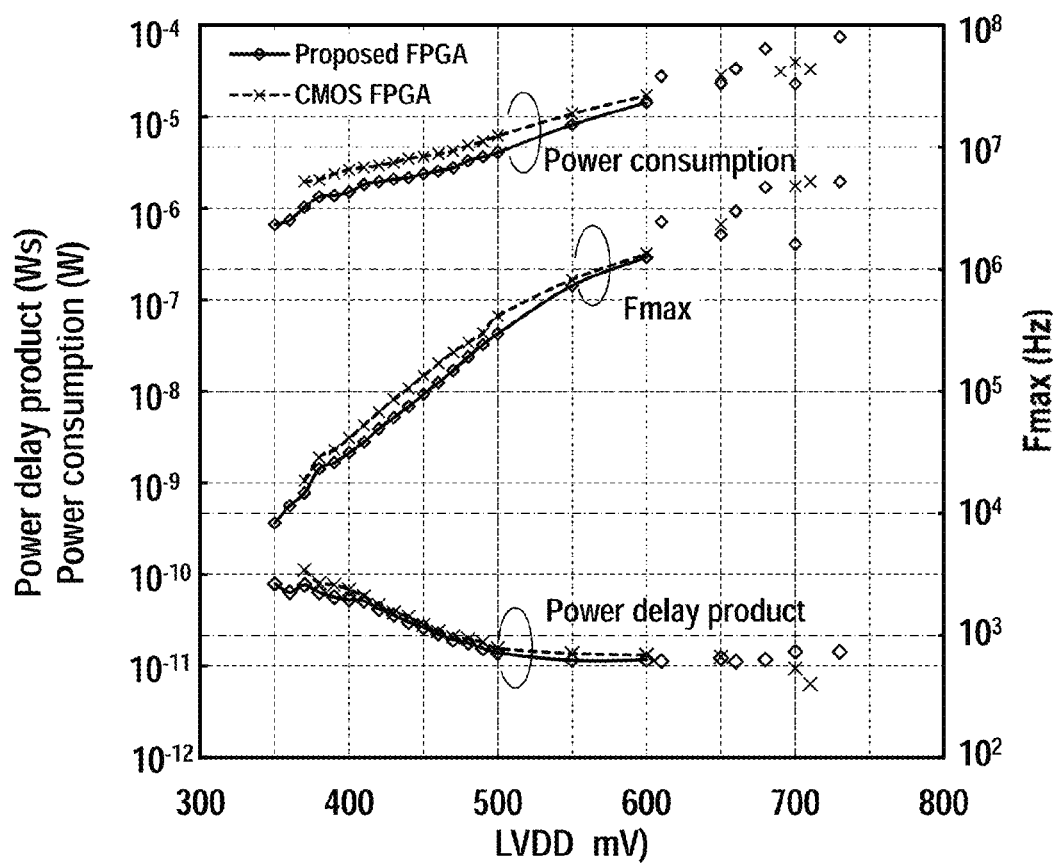
FIG. 28 shows measurement results of maximum operational frequency, power consumption, and power delay product versus voltage LVDD of a fabricated FPGA and a reference example.

Characteristics of the FPGA at room temperature were measured. FIG. 28 shows a maximum operation frequency $F_{max}$, power consumption, and power delay product versus LVDD in the normal mode of the LVDD domain (programmable region) excluding the HVDD domain subjected to power gating.

The FPGA had a circuit configuration in which 10 PLEs were connected in series to form a shift circuit. A periodic pulse shift operation in the FPGA was measured. It is verified that the FPGA keeps operating normally for at least one hour, which indicates that the AM can retain data for at least one hour. In the SPICE simulation, energy for switching context in the context-switching mode is 1.57 nJ.

To verify effectiveness of the APTL-based MUX in the PLE, a reference FPGA (CMOS FPGA) in which a CMOS-standard-cell-based MUX is provided in a PLE was fabricated. The area of the PLE and the number of transistors of the PLE in the APTL-based MUX are smaller than the area of the PLE and the number of transistors of the PLE in the CMOS-standard-cell-based MUX by 5.4% and 5.6%, respectively.

In FIG. 28, solid lines each denote an average value of the proposed FPGA (measured number n=10, HVDD=2.1 V), and dotted lines each denote an average value of the reference CMOS FPGA (n=8). A minimum operation voltage $V_{min}$ of the proposed FPGA is 350 mV, and $F_{max}$ thereof is 8.33 kHz; $V_{min}$ of the CMOS FPGA is 380 mV and $F_{max}$ thereof is 26.0 kHz. There is no significant difference in driving frequency between the proposed FPGA and the CMOS FPGA. In the case where the operation voltage is 380 mV, the average power consumptions (n=4) of the proposed FPGA and the CMOS FPGA are 1.33 µW and 2.04 µW, respectively. This indicates that the power consumption of the proposed FPGA is smaller than that of the CMOS FPGA by approximately 35% although the operation speed of the proposed FPGA is maintained, which produces an effect equivalent to that obtained when the MUX in the PLE is an APTL-based MUX.

We reported an FPGA formed through a hybrid process using a 0.18-µm CMOS FET and a 0.8-µm CAAC-IGZO FET, as disclosed in Non-Patent Document 3. When this conventional FPGA was measured in a manner similar to that described above, $V_{min}$ was 880 mV and $F_{max}$ at $V_{min}$ was 33.3 kHz. Meanwhile, in the case of the proposed FPGA, $F_{max}$ at 730 mV is 5.21 MHz, which shows that the proposed FPGA has higher operation frequency at lower driving voltage. These results indicate that the processing performance is improved to be 150 times or more as high as that of the conventional design.

The power delay product in the shift operation of 10 PLEs of the proposed FPGA is 15.6 pWs at a driving voltage of 500 mV. The power consumption for the operation of an array of 16 4-bit counters of the conventional FPGA including a volatile memory (SRAM), which is reported in Non-Patent Document 2, is 34.6 µW at a power supply voltage of 0.26 V and an operational frequency of 322 kHz. The power delay product per PLE of the proposed FPGA (1.56 pWs) is substantially equivalent to that of the conventional FPGA (1.68 pWs). Consequently, low-voltage operation and improved performance are achieved by the design methodology proposed in this example.

For example, a PLD, which is reconfigurable in accordance with process requirements, is suitable for sensor network because various sensor network devices are required. The sensor network devices require subthreshold driving at approximately several hundred millivolts in order to be capable of high-performance processing with power obtained from energy harvesting (Non-Patent Documents 1 and 2). Since power consumption of the PLD of one embodiment of the present invention can be reduced in the normal operation without a reduction in operation-speed performance, the PLD can perform subthreshold driving and has performance favorable for a sensor network device.

This application is based on Japanese Patent Application serial no. 2014-190980 filed with Japan Patent Office on Sep. 19, 2014, the entire contents of which are hereby incorporated by reference.

What is claimed is:

1. A semiconductor device comprising:
an output terminal;
a first terminal;
a second terminal;
a first circuit; and
a second circuit,
wherein the first circuit comprises a first transistor, a second transistor, and an inverter,
wherein the second circuit comprises a third transistor, a fourth transistor, a third circuit, and a fourth circuit,
wherein the third circuit comprises a first node,
wherein the fourth circuit comprises a second node,
wherein an input terminal of the inverter is electrically connected to the second terminal,
wherein an output terminal of the inverter is electrically connected to the output terminal,
wherein the first transistor and the second transistor are electrically connected in parallel between the second terminal and a wiring supplied with a first potential,
wherein a gate of the first transistor is electrically connected to the output terminal of the inverter,
wherein the third circuit is configured to make the first node in an electrically floating state,
wherein the fourth circuit is configured to make the second node in an electrically floating state,
wherein the third transistor and the fourth transistor are electrically connected in series between the first terminal and the second terminal,
wherein the first node is electrically connected to the gate of the third transistor, and
wherein the second node is electrically connected to a gate of the fourth transistor.

2. The semiconductor device according to claim 1, further comprising:
a third terminal; and
a fourth terminal,
wherein the third circuit comprises a fifth transistor,
wherein the fourth circuit comprises a sixth transistor,
wherein the fifth transistor is configured to control a conduction state between the third terminal and the first node, and
wherein the sixth transistor is configured to control a conduction state between the fourth terminal and the second node.

3. The semiconductor device according to claim 2, wherein the fifth transistor and the sixth transistor each comprise an oxide semiconductor layer where a channel is formed.

4. An electronic component comprising:
the semiconductor device according to claim 1; and
a lead electrically connected to the semiconductor device.

5. An electronic device comprising:
the semiconductor device according to claim 1; and
at least one of a display device, a touch panel, a microphone, a speaker, an operation key, and a housing.

6. A semiconductor device comprising:
an output terminal;
a first terminal;
a second terminal;
a first circuit; and
a plurality of second circuits,
wherein the plurality of second circuits are electrically connected in parallel between the first terminal and the second terminal,
wherein the first circuit comprises a first transistor, a second transistor, and an inverter,
wherein each of the plurality of second circuits comprises a third transistor, a fourth transistor, a fifth transistor, a sixth transistor, a first node, a second node, a third terminal, and a fourth terminal,
wherein an input terminal of the inverter is electrically connected to the second terminal,
wherein an output terminal of the inverter is electrically connected to the output terminal, wherein the first transistor and the second transistor are electrically connected in parallel between the second terminal and a wiring supplied with a first potential, wherein a gate of the first transistor is electrically connected to the output terminal of the inverter, wherein the third transistor and the fourth transistor are electrically connected in series between the first terminal and the second terminal, wherein the first node is electrically connected to a gate of the third transistor, wherein the second node is electrically connected to a gate of the fourth transistor, wherein the fifth transistor is configured to control a conduction state between the first node and the third terminal, and wherein the sixth transistor is configured to control a conduction state between the second node and the fourth terminal.

7. The semiconductor device according to claim 6, wherein the fifth transistor and the sixth transistor each comprise an oxide semiconductor layer where a channel is formed.

8. The semiconductor device according to claim 6, further comprising a switch circuit, wherein the switch circuit comprises a first pass transistor logic, and wherein the first pass transistor logic comprises a pass transistor and an analog memory that retains a potential of a gate of the pass transistor.

9. The semiconductor device according to claim 8, wherein the analog memory of the first pass transistor comprises a transistor including an oxide semiconductor layer where a channel is formed.

10. The semiconductor device according to claim 6, further comprising a multiplexer, wherein the multiplexer comprises a second pass transistor logic, and wherein the second pass transistor logic comprises a pass transistor and an analog memory that retains a potential of a gate of the pass transistor.

11. The semiconductor device according to claim 10, wherein the analog memory of the second pass transistor comprises a transistor including an oxide semiconductor layer where a channel is formed.

12. An electronic component comprising:
the semiconductor device according to claim 6; and
a lead electrically connected to the semiconductor device.

13. An electronic device comprising:
the semiconductor device according to claim 6; and
at least one of a display device, a touch panel, a microphone, a speaker, an operation key, and a housing.

* * * * *